(12) United States Patent
Essig et al.

(10) Patent No.: US 12,713,980 B2
(45) Date of Patent: Aug. 18, 2026

(54) SEMICONDUCTOR PACKAGE STRUCTURE

(71) Applicant: Advanced Semiconductor Engineering, Inc., Kaohsiung (TW)

(72) Inventors: Kay Stefan Essig, Radebeul (DE); You-Lung Yen, Taoyuan (TW); Bernd Karl Appelt, Holly Springs, NC (US); Jean Marc Yannou, Luc-sur-Mer (FR)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 467 days.

(21) Appl. No.: 18/137,392

(22) Filed: Apr. 20, 2023

(65) Prior Publication Data

US 2024/0355793 A1 Oct. 24, 2024

(51) Int. Cl.

| | |
|---|---|
| ***H10W 90/00*** | (2026.01) |
| ***H10W 70/60*** | (2026.01) |
| ***H10W 70/65*** | (2026.01) |
| ***H10W 70/685*** | (2026.01) |
| ***H10W 74/10*** | (2026.01) |

(52) U.S. Cl.

CPC .......... *H10W 90/00* (2026.01); *H10W 70/611* (2026.01); *H10W 70/65* (2026.01); *H10W 70/685* (2026.01); *H10W 74/117* (2026.01); *H10W 90/722* (2026.01)

(58) Field of Classification Search

None

See application file for complete search history.

(56) References Cited

U.S. PATENT DOCUMENTS

| | | | | |
|---|---|---|---|---|
| 2014/0252646 A1* | 9/2014 | Hung | H10W 20/20 | 257/774 |
| 2019/0139890 A1* | 5/2019 | Lu | H10W 20/42 | |
| 2019/0355687 A1* | 11/2019 | Huang | H10W 70/09 | |
| 2019/0385989 A1* | 12/2019 | Yu | H10W 90/00 | |
| 2020/0161743 A1 | 5/2020 | Ho et al. | | |
| 2023/0039430 A1 | 2/2023 | Yen et al. | | |
| 2023/0094668 A1* | 3/2023 | Chan | H10W 74/019 | 257/737 |

FOREIGN PATENT DOCUMENTS

| | | |
|---|---|---|
| CN | 101764127 A | 6/2010 |

* cited by examiner

*Primary Examiner* — Bilkis Jahan
(74) *Attorney, Agent, or Firm* — Foley and Lardner LLP

(57) ABSTRACT

A semiconductor package structure and a method of manufacturing a semiconductor package structure is provided. The semiconductor package structure includes a carrier and a component. The carrier includes a first part and a second part separated from the first part. The component is disposed under the first part and electrically connected to the second part. The first part is configured to be electrically connected to a device disposed over the first part.

20 Claims, 34 Drawing Sheets

SEMICONDUCTOR PACKAGE STRUCTURE

BACKGROUND

1. Field of the Disclosure

The present disclosure relates to a semiconductor package structure and a method for manufacturing the same.

2. Description of the Related Art

A package may include a die mounted on a carrier, and another die or system may be stacked over the die. In order to connect the upper die to the lower one, electroplated copper pillars, big solder balls, or copper pins may be additionally formed, which is not cost-effective.

SUMMARY

In some embodiments, a semiconductor package structure includes a carrier and a component. The carrier includes a first part and a second part separated from the first part. The component is disposed under the first part and electrically connected to the second part. The first part is configured to be electrically connected to a device disposed over the first part.

In some embodiments, a semiconductor package structure includes a carrier and a component. The component is disposed under the carrier and includes a plurality of pads at an active surface of the component. The carrier includes a trace portion disposed over a backside surface of the component. The trace portion is electrically insulated from the backside surface of the component and electrically connected to the pad of the component.

In some embodiments, a semiconductor package structure includes a carrier and a component. The component is surrounded by the carrier. The carrier includes an interconnection element adjacent to the die. The interconnection element has a first tapered portion and a second tapered portion connected to the first tapered portion. The first tapered portion and the second tapered portion taper in opposite directions.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
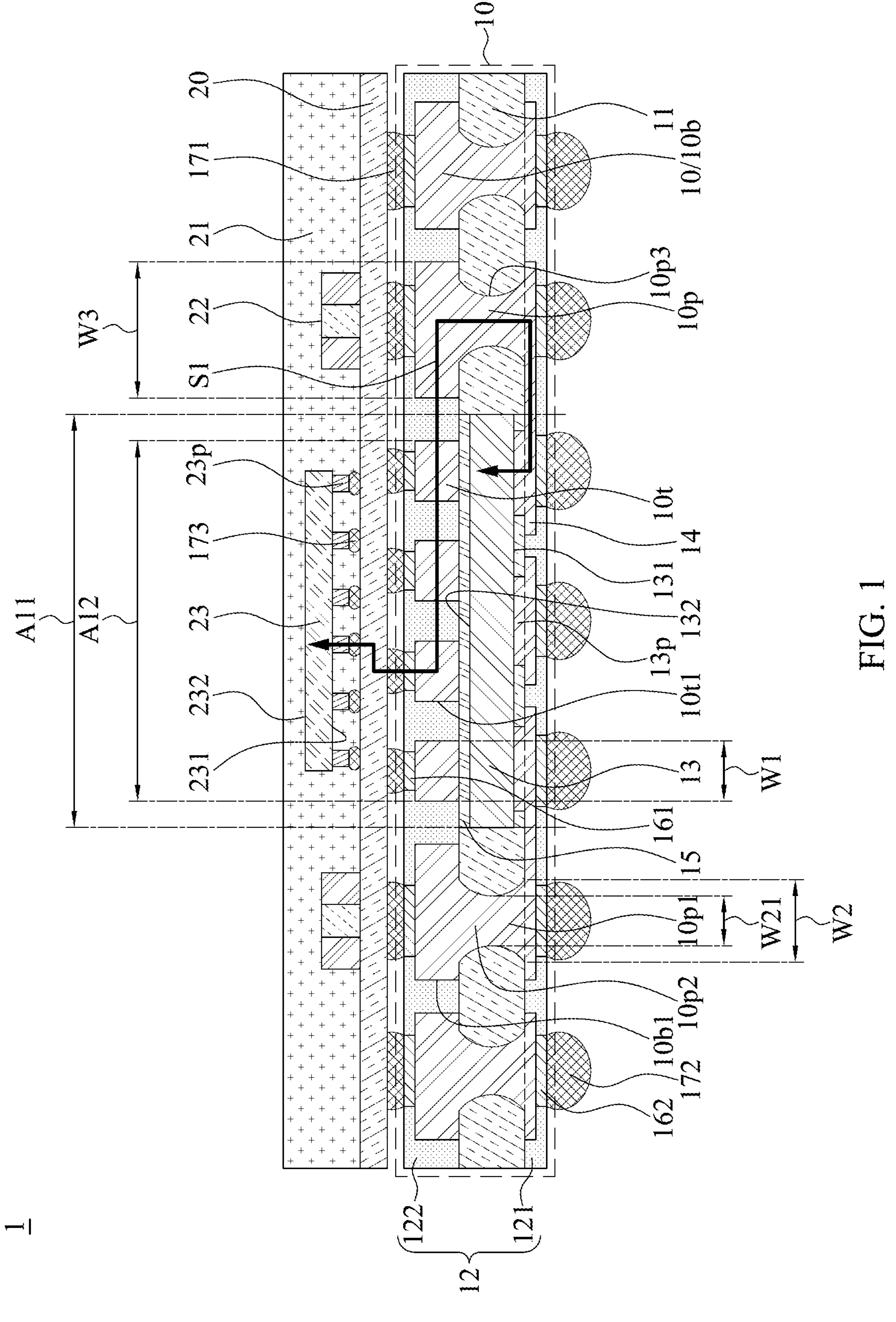
FIG. 1 illustrates a cross-sectional view of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross-sectional view of a semiconductor package structure 1 according to some embodiments of the present disclosure. The semiconductor package structure 1 may include a carrier 10, a dielectric layer 11, a protective layer 12, a component 13, a redistribution structure 14, an insulation layer 15, a plurality of conductive layers 161 and 162, and a plurality of connection elements 171 and 172.

The carrier (or a leadframe) 10 may be surrounded by or embedded in the dielectric layer 11. The dielectric layer 11 may include a single layer or a lamination layer. The material of the dielectric layer 11 may include, for example, an organic material, such as a solder mask, a polyimide (PI), an Ajinomoto build-up film (ABF), and one or more molding compounds. The material of the dielectric layer 11 may include, for example, an inorganic material silicon-oxide ($SiO_x$), or a silicon-nitride ($SiN_x$).

The carrier 10 may be covered by the protective layer 12. The dielectric layer 11 may be covered by the protective layer 12. The protective layer 12 may have a portion 122 disposed over the dielectric layer 11 and the other portion 121 disposed under the dielectric layer 11. The protective layer 12 may include a solder mask.

The carrier 10 may be disposed over the component 13. The component 13 may be disposed under the carrier 10. The component (or the die) 13 may be surrounded by the carrier 10. The component 13 may be surrounded by or embedded in the dielectric layer 11. The component 13 may have an active surface (or a lower surface) 131 and a backside surface (or an upper surface) 132 opposite to the active surface 131. The active surface 131 may face the redistribution structure 14 or the redistribution structure 14 may be disposed over the active surface 131. The backside surface 132 may face the trace portion 10*t* of the carrier 10. The component 13 may include a plurality of pads 13*p* disposed at the active surface 131. The pads 13*p* of the component 13 may be electrically connected to the active surface 131 of the component 13 (or the circuits at or adjacent to the active surface 131). The pads 13*p* may protrude from the active surface 131. In some embodiments, the pads 13*p* may be partially or completely buried in the component 13. The pads 13*p* may include metal or a metal alloy such as copper (Cu), gold (Au), aluminum (Al), or the alloy thereof.

The component 13 may include a semiconductor die. In some embodiments, the component 13 may include one or more processing elements at or adjacent to the active surface 131 as well as one or more memory elements at or adjacent to the active surface 131 and electrically connected to the processing elements. The processing element(s) and the memory element(s) may be divided from or originate in a monolithic processing unit (e.g., a CPU, an MPU, a GPU, an MCU, an ASIC, or the like). In some embodiments, the processing element may be a CPU chiplet, an MCU chiplet, a GPU chiplet, an ASIC chiplet, or the like.

The carrier 10 may include a base portion (or a part) 10*b*, a trace portion (or a part) 10*t*, and one or more conductive pillars (or a part) 10*p*. The base portion 10*b*, the trace portion 10*t*, and the conductive pillars 10*p* of the carrier 10 may each include metal or a metal alloy such as copper (Cu), gold (Au), aluminum (Al), or the alloy thereof. In some embodiments, the base portion 10*b*, the trace portion 10*t*, and the conductive pillars 10*p* of the carrier 10 may be integrally formed. In particular, the conductive pillars 10*p* may be formed by partial-etching the carrier 10 into a predetermined thickness. The trace portion 10*t* may be formed by partial-etching the carrier 10 with a predetermined pattern. The partial-etching may include a half-etching.

The base portion 10*b* may be connected to the trace portion 10*t*. The base portion 10*b* may around or surround the trace portion 10*t*. The base portion 10*b* and the trace portion 10*t* have substantially the same height. The base portion 10*b* may be connected to the conductive pillars 10*p*. The base portion 10*b* may be disposed over the conductive pillars 10*p*. The base portion 10*b* may be disposed over the dielectric layer 11. The base portion 10*b* may be surrounded by the portion 122 of the protective layer 12. The base portion 10*b* may not overlap the component 13 in a direction perpendicular to the backside surface 132 of the component 13.

The conductive pillars 10*p* may be electrically connected to the trace portion 10*t* through the base portion 10*b*. The trace portion 10*t* may be electrically connected to the redistribution structure 14 through the conductive pillars 10*p*. The conductive pillars 10*p* may be referred to as interconnection elements. The base portion 10*b* in the cross section of FIG. 1 may form a base of the conductive pillars 10*p* and thus may be referred to as a part of the conductive pillars 10*p*.

The conductive pillars 10*p* may be disposed in the dielectric layer 11. The conductive pillars (or the interconnection elements) 10*p* may be embedded in the dielectric layer 11. The conductive pillars 10*p* may extend through the dielectric layer 11. The conductive pillars 10*p* may be disposed between the portions 121 and 122 of the protective layer 12. The one or more conductive pillars 10*p* may be adjacent to the component 13. The conductive pillars 10*p* may be around the component 13. The conductive pillars 10*p* may extend between the trace portion 10*t* and the component 13 in a direction vertical to the backside surface 132 of the component 13. The conductive pillars 10*p* may extend between the trace portion 10*t* and the redistribution structure 14 in a direction vertical to the backside surface 132 of the component 13.

The conductive pillars 10*p* may be disposed over the redistribution structure 14. The conductive pillars 10*p* may be electrically connected to the redistribution structure 14. The redistribution structure 14 may include a conductive pad(s), a trace(s), a via(s), or other interconnection(s) embedded in the portion 121 of the protective layer 12. The redistribution structure 14 may not have a seed layer. In some embodiments, the redistribution structure 14 may include a seed layer in contact with the pads 13*p* and the conductive pillars 10*p*. The redistribution structure 14 may be electrically connected to the component 13 (or the pads 13*p*). The conductive pillars 10*p* may be electrically connected to the component 13 through the redistribution structure 14.

The redistribution structure 14 may be electrically connected to the plurality of connection elements 172 through the conductive layer 162. The connection elements 172 may be disposed under the redistribution structure 14. The component 13 may be electrically connected to an external system, device, or circuit (not shown) through the redistribution structure 14 and the connection elements 172. The connection elements 172 may include a solder bump. The material of the conductive layer 162 may include nickel and gold. The conductive layer 162 may include electroless Nickel immersion Gold (ENIG). The conductive layer 162 may improve the bondability of the connection elements 172. In some embodiments, there may be an intermetallic layer between the conductive layer 162 and the connection elements 172.

The conductive pillar (or the interconnection element) 10*p* includes a monolithic structure. The conductive pillar 10*p* may have a tapered portion 10*p*1 and a tapered portion 10*p*2 connected to the tapered portion 10*p*1. The tapered portion 10*p*1 and the tapered portion 10*p*2 may taper in opposite directions. The tapered portion 10*p*1 may taper in a direction toward the base portion 10*b*. The tapered portion 10*p*2 may taper in a direction toward the redistribution structure 14. The conductive pillar 10*p* has a double-tapering or a concave profile. The double-tapering or concave profile may be induced by the undercut effect during the etching of a conductive base to form the conductive pillar 10*p*. The conductive pillar 10*p* may have a lateral surface 10*p*3 along the tapered portions 10*p*1 and 10*p*2. The lateral surface 10*p*3 may have a concave surface. Furthermore, the lateral surface 10*p*3 of the conductive pillar 10*p* may have a curved surface or an inwardly dished surface.

The trace portion (or the part) 10*t* may be surrounded by the base portion 10*b* or the conductive pillars 10*p*. The base portion 10*b* or the conductive pillars 10*p* may be disposed around the trace portion 10*t*. The trace portion 10*t* may be surrounded by the portion 122 of the protective layer 12. As shown in the cross section of FIG. 1, the trace portion 10*t* may include a plurality of sections separated from each other. In some embodiments, one or more of the sections of the trace portion 10*t* may be connected in another cross section (not shown). Furthermore, the sections of the trace portion 10*t* may be separated from the base portion 10*b* or the conductive pillars 10*p* in the cross section of FIG. 1. However, one or more of the sections of the trace portion 10*t* may be connected to the base portion 10*b* or the conductive pillars 10*p* in another cross section (not shown).

The trace portion 10*t* (or the sections thereof) may extend in a direction away from the component 13. The trace portion 10*t* may extend in a direction perpendicular to the backside surface 132 of the component 13 as shown in the cross section of FIG. 1. In some embodiments, the trace portion 10*t* may extend in a direction parallel to the backside surface 132 of the component 13 in another cross section (not shown). In a top view corresponding to the other cross section, the trace portion 10*t* may include a plurality of bending sections staggered and separated from each other. The trace portion 10*t* may be disposed over the component 13 (or the backside surface 132). The trace portion 10*t* may completely overlap the backside surface 132 of the component 13 in a direction perpendicular to the backside surface 132 of the component 13. The component 13 may be disposed between the trace portion 10*t* and the redistribution structure 14. As shown in FIG. 1, the redistribution structure 14 has a projecting area A11 on the backside surface 132 of the component 13, and the trace portion 10*t* has a projecting area A12 on the backside surface 132 of the component 13. The projecting area A11 may partially overlap the projecting area A12. A pattern density of the redistribution structure 14 may be different from that of the trace portion 10*t*. For example, when the redistribution structure 14 is formed by an electroplating process while the trace portion 10*t* is formed by an etching process, the pattern density of the redistribution structure 14 may be greater than that of the trace portion 10*t*. Furthermore, the thickness (or the Z-height) of the trace portion 10*t* may be larger than that of the redistribution structure 14. The trace portion 10*t* may be referred to as a thick conductive pattern, when compared to the redistribution structure 14.

The trace portion 10*t* may have a width W1 in the cross section of FIG. 1. The conductive pillars may have a width (or the bottom width) W2 in the cross section of FIG. 1. The width W1 of the trace portion 10*t* may be smaller than the width W2 of the conductive pillars 10*p*. The conductive pillars may further have a central width W21 in the cross section of FIG. 1. The conductive pillar 10*p* has a double-tapering profile. In other words, the central width W21 at the middle of the conductive pillar 10*p* may be smaller than the bottom width W2 at the end of the conductive pillar 10*p*. The base portion 10*b* may have a width W3 in the cross section of FIG. 1. The width W1 of the trace portion 10*t* may be smaller than the width W3 of the base portion 10*b*. The width W2 of the conductive pillar 10*p* may be smaller than the width W3 of the base portion 10*b*.

The insulation layer (or adhesive layer) 15 may be disposed between the trace portion 10*t* and the backside surface 132 of the component 13. At least one of the sections of the trace portion 10*t* may be exposed from the insulation layer 15. The trace portion 10*t* of the carrier 10 may be free from contacting the component 13. The trace portion 10*t* may be electrically insulated from the backside surface 132 of the component 13 through the insulation layer 15. Given that the trace portion 10*t* is electrically connected to the redistribution structure 14 through the conductive pillars 10*p* and that the pads 13*p* are electrically connected to the redistribution structure 14, the trace portion 10*t* may be electrically connected to the pads 13*p* of the component 13.

The insulation layer 15 may include an adhesive layer attaching the backside surface 132 of the component 13 to the trace portion 10*t* of the carrier 10. The insulation layer 15 may be electrically isolated but thermally conductive. The insulation layer 15 may be beneficial to the thermal dissipation from the component 13 to the carrier 10. The insulation layer 15 may include heat dissipation gel or thermal interface material, which may include silicone, wax, polymer, or other suitable materials.

The base portion 10*b* may have a lateral surface 10*b*1 and the trace portion 10*t* may have a lateral surface 10*t*1. Given that the base portion 10*b* and the trace portion 10*t* may be formed in the same partial-etching process, the surface roughnesses of the lateral surfaces 10*b*1 and 10*t*1 may be substantially the same. As shown in FIG. 1, the lateral surfaces 10*b*1 and 10*t*1 may be flat. In some embodiments, the lateral surfaces 10*b*1 and 10*t*1 may be curved or tapered because of the partial-etching process. The extent of the curvature and tapering depends based on the etching depth or the type of etchant. The base portion 10*b* and the trace portion 10*t* of the carrier 10 may be electrically connected to the plurality of connection elements 171 through the conductive layer 161. The connection elements 171 may be disposed over the carrier 10. The connection elements 171 may include a solder bump. The material of the conductive layer 161 may include nickel and gold. The conductive layer 161 may include electroless Nickel immersion Gold (ENIG). The conductive layer 161 may improve the bondability of the connection elements 171. In some embodiments, there may be an intermetallic layer between the conductive layer 161 and the connection elements 171.

The carrier 10 (including the trace portion 10*t*, the base portion 10*b*, and the conductive pillars 10*p*), the dielectric layer 11, the protective layer 12, the component 13, the redistribution structure 14, and the insulation layer 15 may be collectively referred to as a semiconductor package structure 100 electrically connected to other systems, components, and devices stacked thereover. The semiconductor package structure 1 may further include a carrier 20, an encapsulant 21, a passive component 22, a component 23, and a plurality of connection elements 173. The carrier 20, the encapsulant 21, the passive component 22, a component 23, and a plurality of connection elements 173 may be collectively referred to as a package and may be stacked over and electrically connected to the semiconductor package structure 100.

The carrier 20 may be electrically connected to the semiconductor package structure 100 through the conductive pillars 10$p$. In the present disclosure, the trace portion 10$t$ provides an electrical connection between the carrier 20 and the semiconductor package structure 100. As shown in FIG. 1, a transmission path S1 may be established among the component 23, the carrier 20, the trace portion 10$t$, the conductive pillars 10$p$, the redistribution structure 14, and the component 13. Referring to the electrical transmission path S1, the trace portion 10$t$ may be configured to be electrically connected to the component 23 through the carrier 20. In addition to the conductive pillars 10$p$, the trace portion 10$t$ disposed over the backside surface 132 of the component 13 increases the routing area between the semiconductor package structure 100 and the carrier 20. As such, the I/O density and the bandwidth of the semiconductor package structure 100 can be increased.

In some cases, the stacking components may be electrically connected to each other through an electroplated conductive element or a solder bump. However, the formation of the electroplated conductive element (or the solder bump) would increase the manufacturing complexity and the cost. In the present disclosure, the component 23 stacked over the component 13 can be electrically connected to the double-tapering conductive pillars 10$p$ which are formed by a partial-etching process from the carrier 10. The formation of the partially-etched conductive pillar requires a low cost, high throughput process, and the process costs of semiconductor package structure 1 can be reduced by eliminating at least one electroplating process. Furthermore, the partial-etched conductive pillars of the present disclosure can be more reliable than the electroplated conductive element.

Furthermore, the component 13 may be configured to be electrically connected to the component 23 through the conductive pillar 10$p$, the redistribution structure 14, and the trace portion 10$t$. The redistribution structure 14 is disposed under and electrically connected to the component 23. The redistribution structure 14 and the partially-etched trace portion 10$t$ disposed at the opposite sides of the semiconductor package structure 100 achieve the heterogeneous integration of the high pattern density fan-out redistribution structure and the thick conductive pattern.

The carrier 20 may be electrically connected to a plurality of pads 23$p$ of the component 23 through the connection elements 173. The carrier 20 may be electrically connected to the passive component 22. The carrier 20, the passive component 22, and the component 23 may be covered by the encapsulant 21.

The carrier 20 may include an interposer. In some embodiments, the carrier 20 may include, for example, a printed circuit board (PCB), such as a paper-based copper foil laminate, a composite copper foil laminate, or a polymer-impregnated glass-fiber-based copper foil laminate. The encapsulant 21 may include an epoxy resin including fillers, a molding compound (e.g., an epoxy molding compound or another molding compound), polyimide, a phenolic compound or material, a material including silicone dispersed therein, or a combination thereof. The passive component 22 may include a resistor, capacitor, inductor, or the like. The component 23 may include a semiconductor die. In some embodiments, the component 23 may include one or more processing elements and one or more memory elements electrically connected to the processing elements. The processing element(s) and the memory element(s) may be divided from or originate in a monolithic processing unit (e.g., a CPU, an MPU, a GPU, an MCU, an ASIC, or the like). In some embodiments, the processing element may be a CPU chiplet, an MCU chiplet, a GPU chiplet, an ASIC chiplet, or the like.

FIG. 1A, FIG. 1B, FIG. 1C, FIG. 1D, FIG. 1E, FIG. 1F, FIG. 1G, and FIG. 1H illustrate one or more stages of an example of a method for manufacturing a semiconductor package structure (e.g., the semiconductor package structure 1) according to some embodiments of the present disclosure.

Figure 1A:
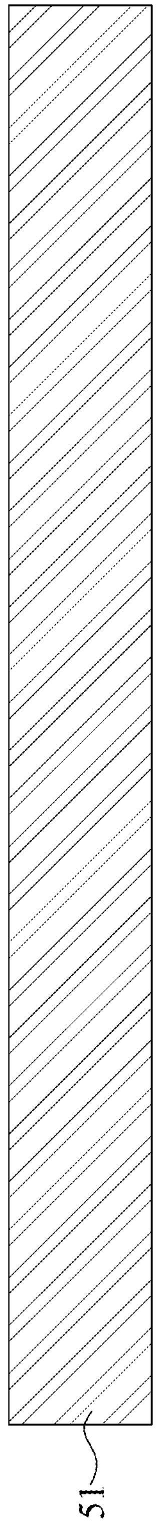
FIG. 1A, FIG. 1B, FIG. 1C, FIG. 1D, FIG. 1E, FIG. 1F, FIG. 1G, and FIG. 1H illustrate one or more stages of an example of a method for manufacturing a semiconductor package structure according to some embodiments of the present disclosure.

Referring to FIG. 1A, a conductive base 51 is provided. The conductive base 51 may include metal or a metal alloy such as copper (Cu), gold (Au), aluminum (Al), or the alloy thereof.

Figure 1B:
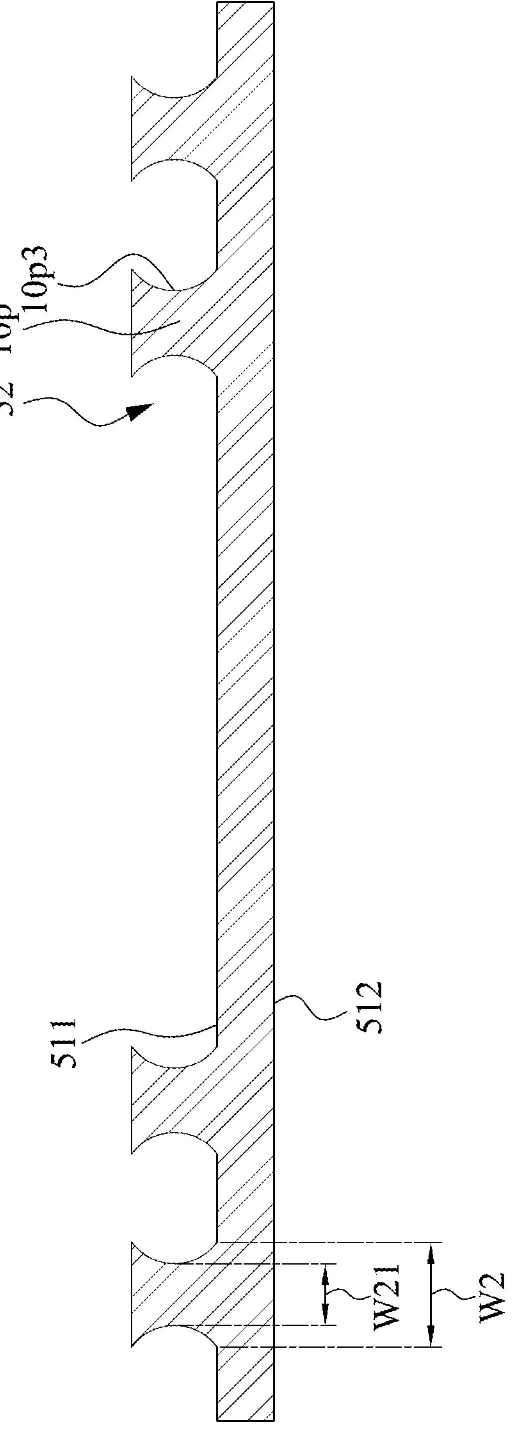

Referring to FIG. 1B, the conductive base 51 may be partially etched to form a surface 511 and a plurality of conductive pillars (or interconnection elements) 10$p$. The partial-etching may include half-etching. The conductive base 51 may have a surface 512 opposite to the surface 511. The conductive pillars 10$p$ may have a lateral surface 10$p$3. The surface 511 may be substantially flat surface or may be a curved surface. Owing to the undercut effect of the partially etching process, the lateral surface 10$p$3 may have at least two portions tapering in opposite directions. The conductive pillar 10$p$ has a double-tapering or a concave profile. The lateral surface 10$p$3 may have concave surface, inwardly dished surface, or curved surface. In some embodiments, if the etching depth is shorter, the undercut effect may be relatively small and the conductive pillar 10$p$ may have a single-tapering shape. A central width W21 of the conductive pillar 10$p$ may be smaller than a bottom width W2 of the conductive pillar 10$p$. The surface 511 of the conductive base 51 and the lateral surfaces 10$p$3 of the conductive pillars 10$p$ define a space 52.

Figure 1C:
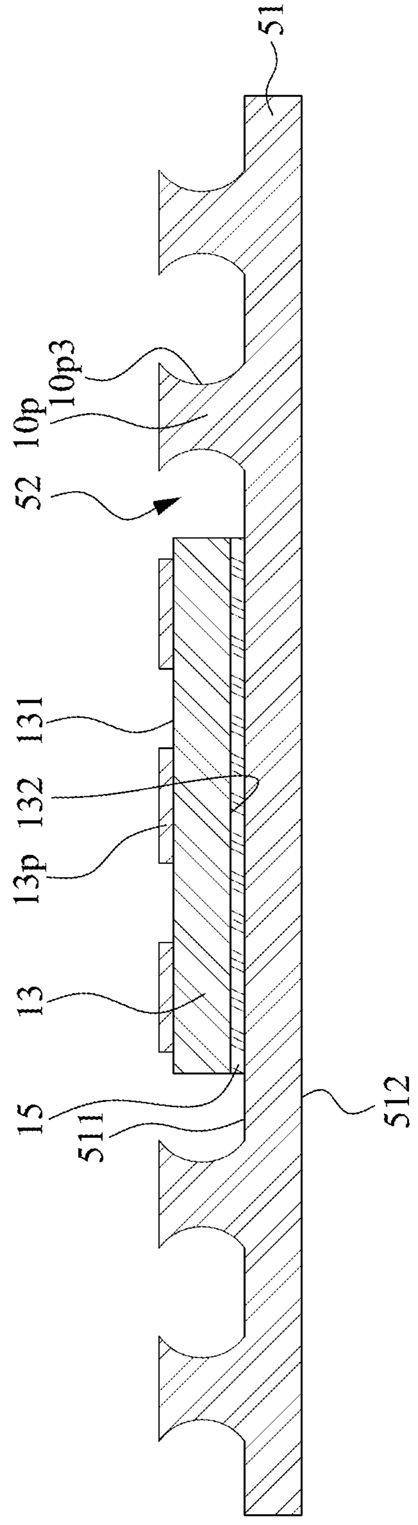

Referring to FIG. 1C, a component (or a die) 13 may be attached to (or bonded on) the surface 511 of the conductive base 51 through an adhesive layer (or an insulation layer) 15. The component 13 is within the space 52. The component 13 has an active surface 131 and a backside surface 132. The backside surface 132 faces the surface 511 of the conductive base 51. The component 13 may include a plurality of pads 13$p$ at the active surface 131.

Figure 1D:
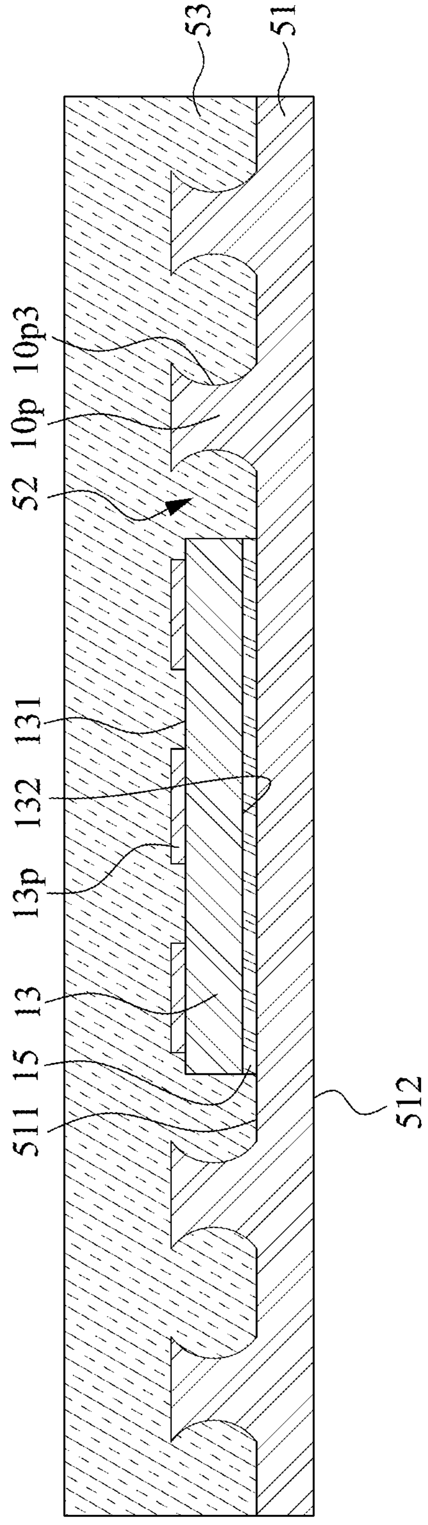

Regarding to FIG. 1D, a dielectric material 53 is formed on the conductive base 51 to encapsulate the conductive pillars 10$p$ and the component 13. The dielectric material 53 may include a single layer or a lamination layer. The dielectric material 53 may include, for example, an organic material, such as a solder mask, a polyimide (PI), an Ajinomoto build-up film (ABF), and one or more molding compounds. The dielectric material 53 may include, for example, an inorganic material silicon-oxide ($SiO_x$), or a silicon-nitride ($SiN_x$).

Figure 1E:
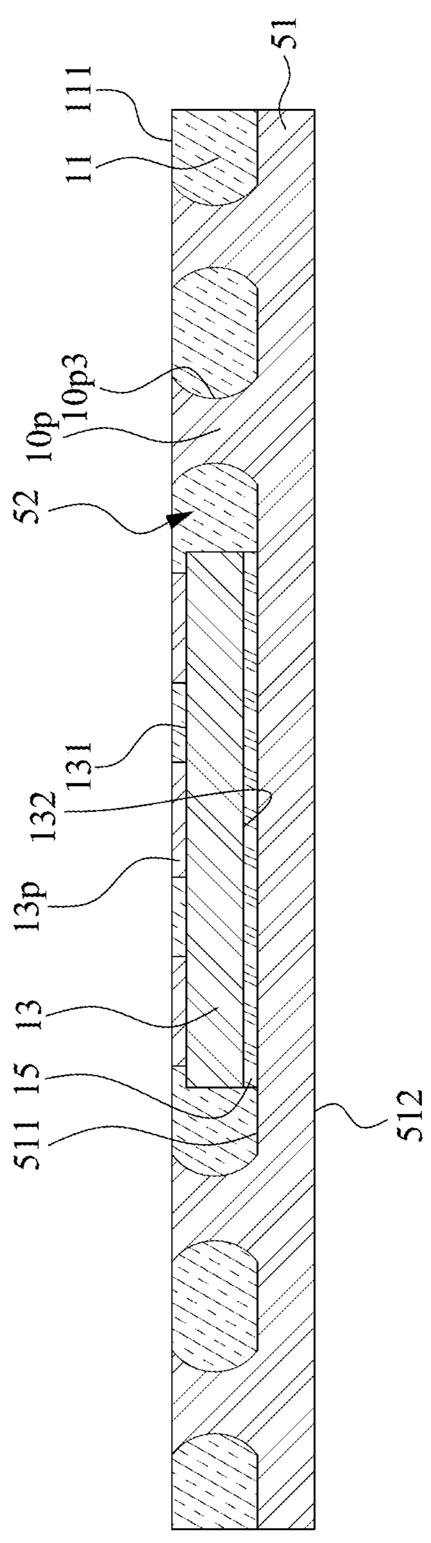

Referring to FIG. 1E, the dielectric material 53 is grinded to form a dielectric layer 11 having a surface 111 facing away from the conductive base 51. The surface 111 of the dielectric layer 11, an upper surface of the conductive pillar 10$p$, and/or an upper surface of the pads 13$p$ are substantially coplanar.

Figure 1F:
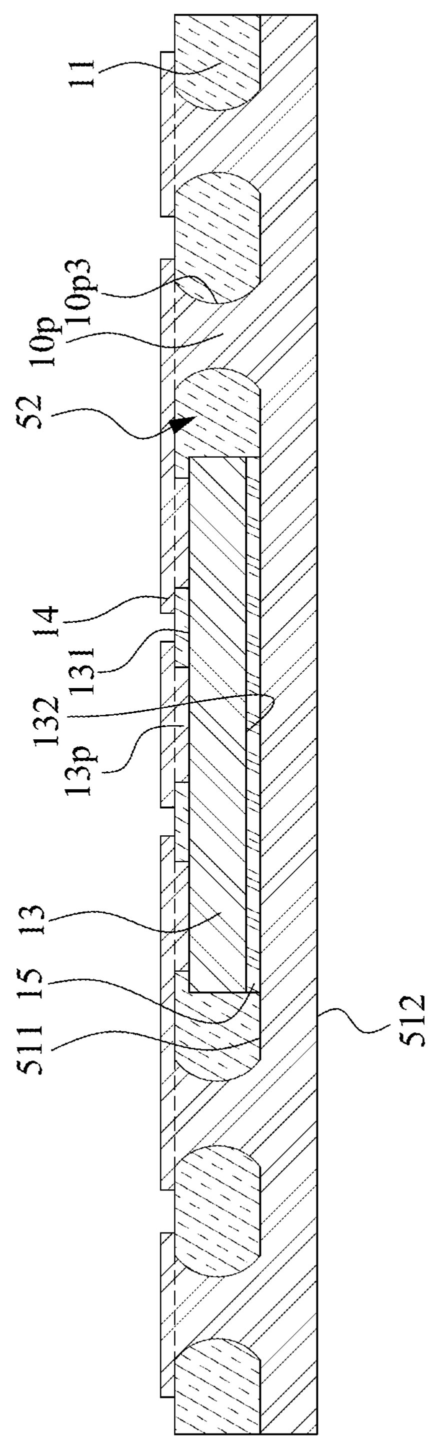

Referring to FIG. 1F, a redistribution structure 14 may be formed over the pads 13$p$ of the component 13, the conductive pillars 10$p$, and the dielectric layer 11. The redistribution structure 14 may be formed by an electroplating process. The redistribution structure 14 may be electrically connected to the pads 13$p$ of the component 13 and the conductive pillars 10$p$. In some embodiments, the redistribution structure 14 may not have a seed layer. In some embodiments, the redistribution structure 14 may include a seed layer contacting the pads 13$p$ of the component 13, the conductive pillars 10$p$, and the dielectric layer 11.

Figure 1G:
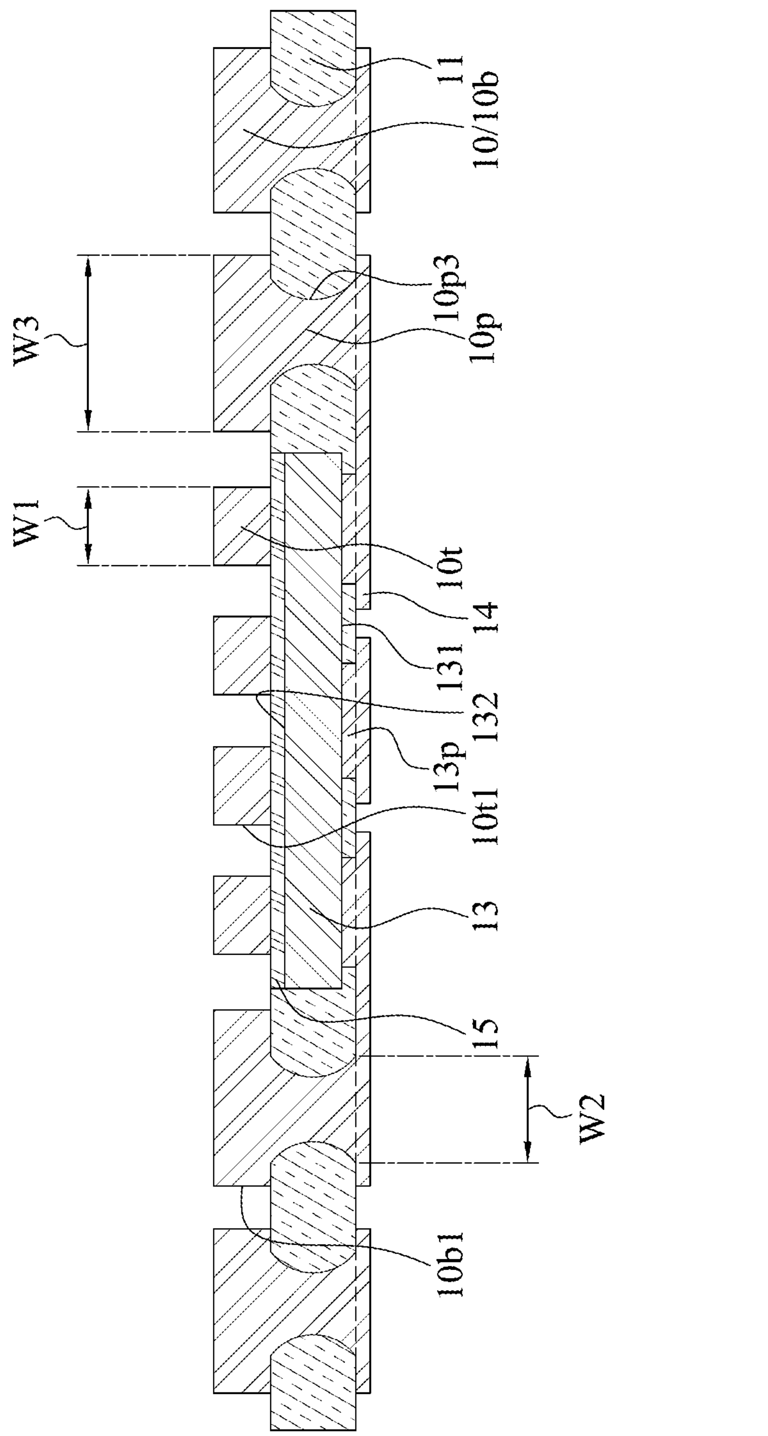

Referring to FIG. 1G, the conductive base 51 is partially etched from the surface 512 to form a base portion 10*b* over the conductive pillar 10*p* and a trace portion 10*t* over the backside surface 132 of the component 13. The base portion 10*b*, the trace portion 10*t*, and the conductive pillars 10*p* may be referred to as a carrier 10. A lateral surface 10*t*1 of the trace portion 10*t* and a lateral surface 10*b*1 of the base portion 10*b* may be flat. In some embodiments, the lateral surfaces 10*t*1 and 10*b*1 of the trace portion 10*t* and the base portion 10*b* may be curved or tapered because of the partial-etching process. The extent of the curvature and tapering depends based on the etching depth or the type of etchant. The trace portion 10*t* may include a plurality of sections separated from each other in the cross section of FIG. 1G. In some embodiments, one or more of the sections of the trace portion 10*t* may be connected. The trace portion 10*t* may be separated from the base portion 10*b* in the cross section of FIG. 1G. The trace portion 10*t* may be connected to the base portion 10*b* in another cross section. The base portion 10*b* may be connected to the conductive pillars 10*p*. A width W1 of the trace portion 10*t* may be smaller than the width W2 of the conductive pillar 10*p*. The width W1 of the trace portion 10*t* may be smaller than a width W3 of the base portion 10*b*.

Figure 1H:
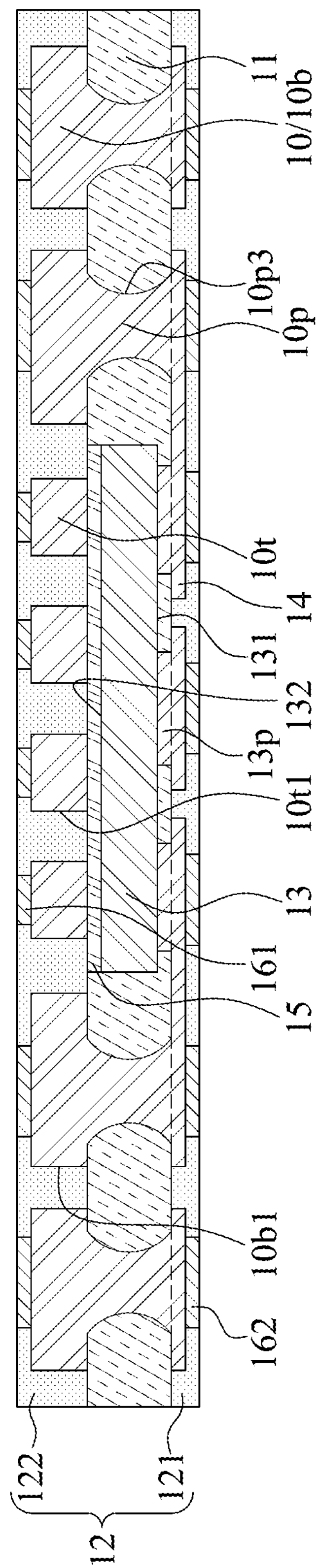

Referring to FIG. 1H, a portion 121 of a protective layer 12 is formed on the redistribution structure 14 and the other portion 122 of the protective layer 12 is formed on the trace portion 10*t* and the base portion 10*b* of the carrier 10 to form a semiconductor package structure 100 as shown in FIG. 1. A conductive layer 161 may be formed on the trace portion 10*t* and the base portion 10*b*. A conductive layer 162 may be formed on the redistribution structure 14. The conductive layers 161 and 162 may be surrounded by the protective layer 12.

Afterwards, a carrier 20 provided with an encapsulant 21, a passive component 22, and a component 23 may be bonded on the trace portion 10*t* and the base portion 10*b* of the carrier 10 to form a semiconductor package structure 1 as shown in FIG. 1. Furthermore, a plurality of connection elements 172 may be formed on the conductive layer 162.

Figure 2:
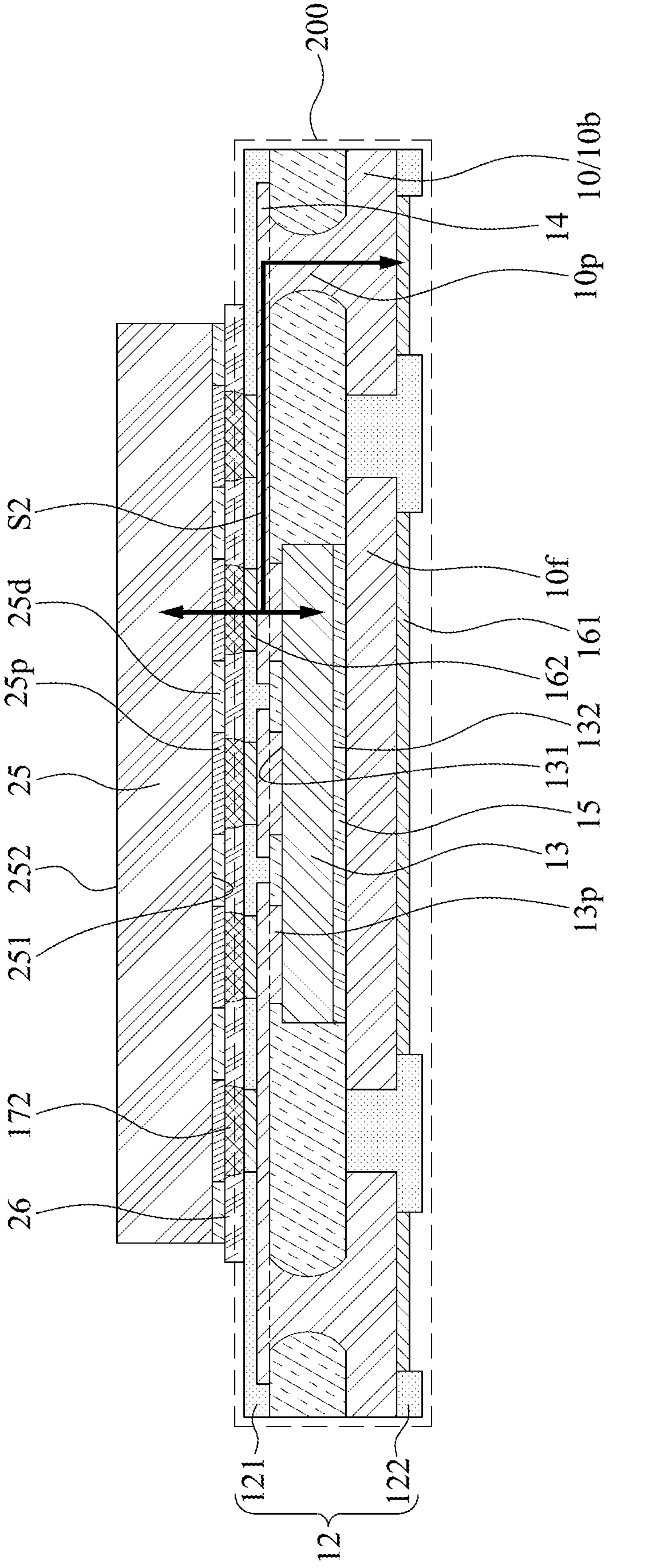
FIG. 2 illustrates a cross-sectional view of a semiconductor package structure according to some embodiments of the present disclosure.

FIG. 2 is a cross-sectional view of a semiconductor package structure 2 in accordance with some embodiments of the present disclosure. The semiconductor package structure 2 in FIG. 2 is similar to the semiconductor package structure 1 in FIG. 1. Therefore, some detailed descriptions may refer to corresponding preceding paragraphs and are not repeated hereinafter for conciseness, with differences therebetween as follows.

The semiconductor package structure 2 may include a landing portion 10*f* disposed over the backside surface 132 of the component 13, rather than the trace portion 10*t* of FIG. 1. The landing portion 10*f* may be wider than the backside surface 132 of the component 13. The landing portion 10*f* may be connected to a land grid array (LGA) of an external substrate (not shown). The carrier 10 (including the landing portion 10*f*, the base portion 10*b*, and the conductive pillars 10*p*), the dielectric layer 11, the protective layer 12, the component 13, the redistribution structure 14, and the insulation layer 15 may be collectively referred to as a semiconductor package structure 200 electrically connected to other systems, components, and devices stacked thereover.

The semiconductor package structure 2 further includes a wafer level chip 25 stacked over the semiconductor package structure 200. In some embodiments, the wafer level chip 25 may include a single die, strip of dies, or a passive component. The wafer level chip 25 may have a plurality of input/outputs (I/Os) with a fine pitch. Thus, the redistribution structure 14 of the semiconductor package structure 2 may be electrically connected to a wafer level chip 25 through the connection elements 172. An electrical transmission path S2 may be established among the wafer level chip 25, the redistribution structure 14, the component 13, and the conductive pillars 10*p*. The wafer level chip 25 may be electrically connected to the component 13 through the redistribution structure 14. In some embodiments, the wafer level chip 25 may be electrically connected to an external substrate through the conductive pillars 10*p* and the landing portion 10*f*.

In the present disclosure, the wafer level chip 25 stacked over the component 13 can be electrically connected to the double-tapering conductive pillars 10*p* which are formed by a partial-etching process from the carrier 10. The formation of the partially-etched conductive pillar requires a low cost, high throughput process, and the process costs of semiconductor package structure 2 can be reduced by eliminating at least one electroplating process. Furthermore, the partial-etched conductive pillars of the present disclosure can be more reliable than the electroplated conductive element.

The semiconductor package structure 2 further includes an encapsulant 26 disposed between the wafer level chip 25 and the carrier 10 and surrounding the connection elements 172. The wafer level chip 25 may have an active surface 251 and a backside surface 256 opposite to the active surface 251. The active surface 251 may face the carrier 10. The wafer level chip 25 may include a plurality of pads 25*p* and a dielectric layer 25*d* surrounding the pads 25*p*. The pads 25*p* are electrically connected to the connection elements 172.

Figure 2A:
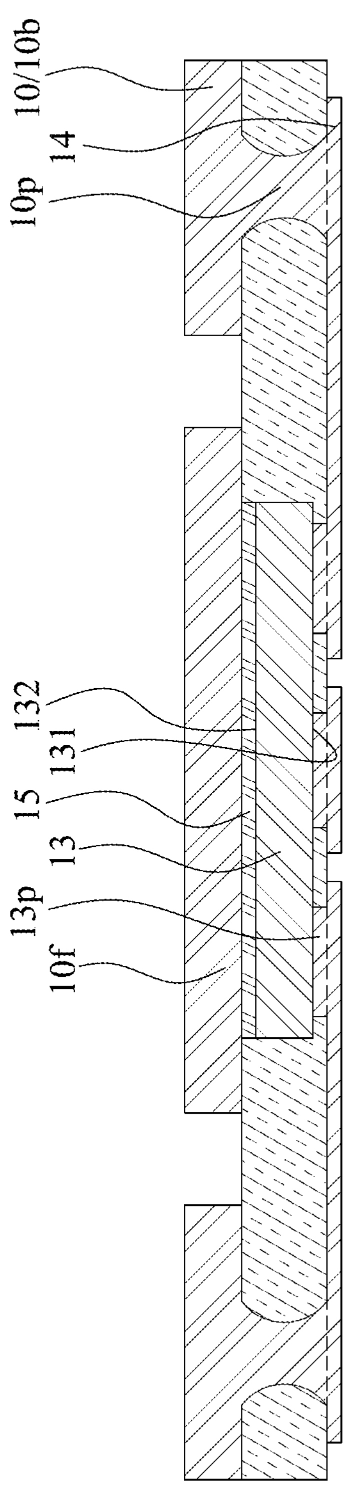
FIG. 2A and FIG. 2B illustrate one or more stages of an example of a method for manufacturing a semiconductor package structure according to some embodiments of the present disclosure.
Figure 2B:
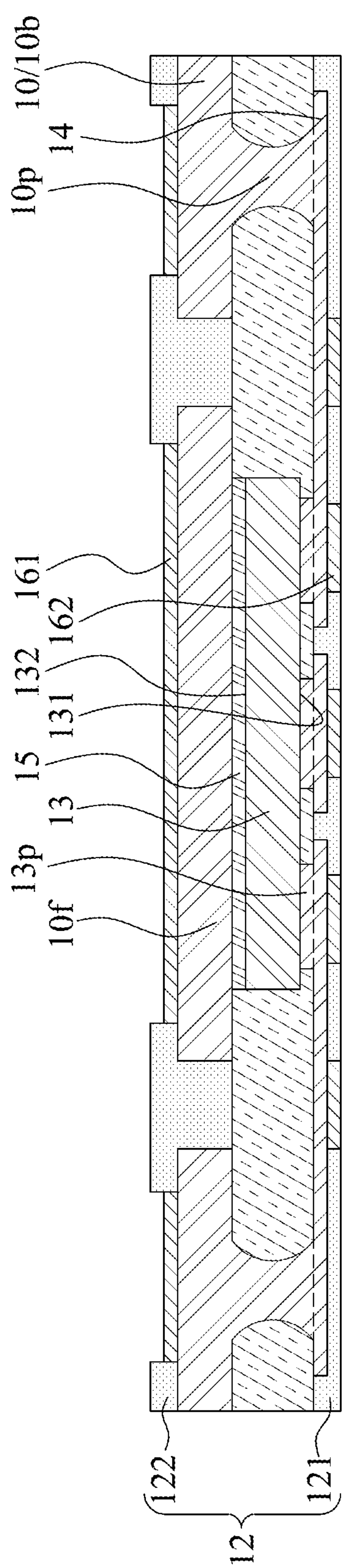

FIG. 2A and FIG. 2B illustrate one or more stages of an example of a method for manufacturing a semiconductor package structure (e.g., the semiconductor package structure 2) according to some embodiments of the present disclosure. The stages of the method for manufacturing the semiconductor package structure 2 may include the stages as illustrated in FIGS. 1A, 1B, 1C, 1D, 1E, and 1F. The stages of FIG. 2A and FIG. 2B may follow the stages of FIGS. 1A, 1B, 1C, 1D, 1E, and 1F.

Referring to FIG. 2A, the conductive base 51 is etched from the surface 512 to form a base portion 10*b* over the conductive pillar 10*p* and a landing portion 10*f* over the backside surface 132 of the component 13. The base portion 10*b*, the landing portion 10*f*, and the conductive pillars 10*p* may be referred to as a carrier 10. The landing portion 10*f* may be separated from the base portion 10*b* in the cross section of FIG. 2A. The landing portion 10*f* may be connected to the base portion 10*b* in another cross section. The base portion 10*b* may be connected to the conductive pillars 10*p*.

Referring to FIG. 2B, a portion 121 of a protective layer 12 is formed on the redistribution structure 14, and the other portion 122 of the protective layer 12 is formed on the landing portion 10*f* and the base portion 10*b* of the carrier 10 to form a semiconductor package structure 200 as shown in FIG. 2. A conductive layer 161 may be formed on the landing portion 10*f* and the base portion 10*b*. A conductive layer 162 may be formed on the redistribution structure 14. The conductive layers 161 and 162 may be surrounded by the protective layer 12.

Afterwards, a wafer level chip 25 may be bonded on the redistribution structure 14 through a plurality of connection elements 172, and an encapsulant 26 may be formed to surround the connection elements 172 to form a semiconductor package structure 2 as shown in FIG. 2.

Figure 3:
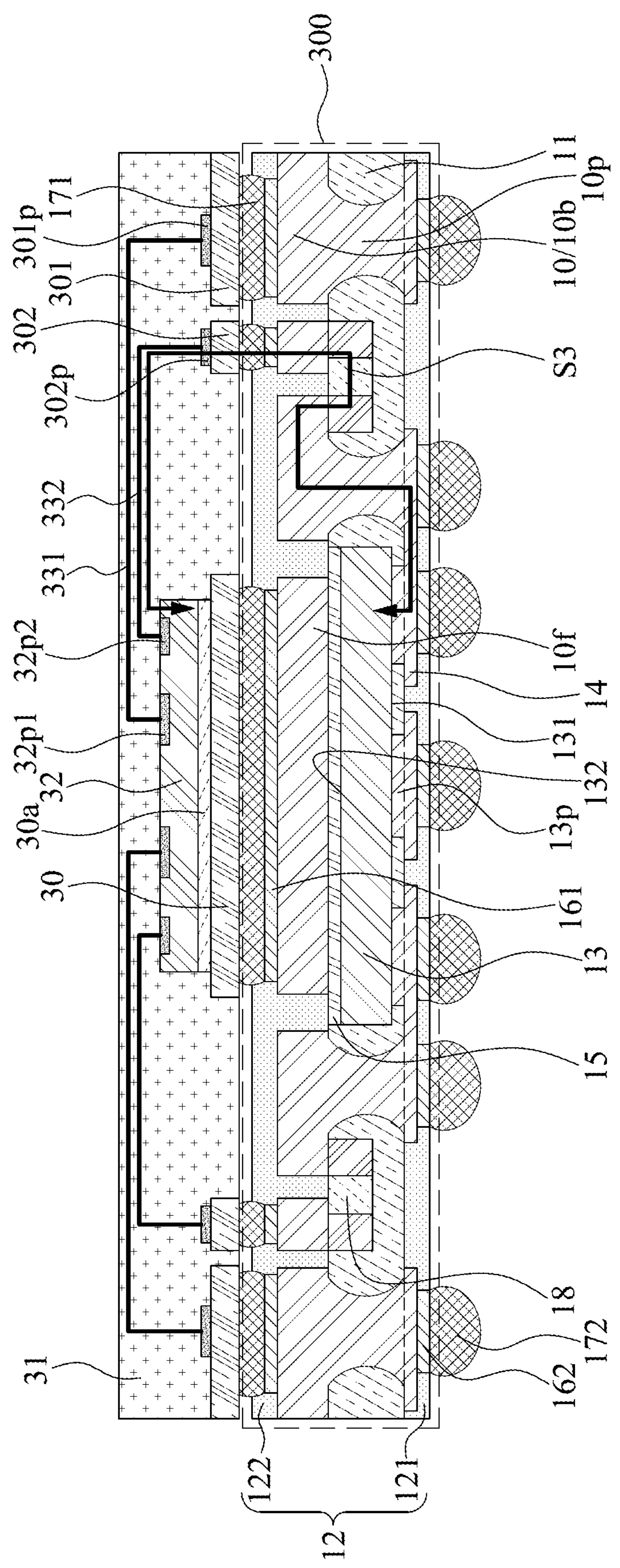
FIG. 3 illustrates a cross-sectional view of a semiconductor package structure according to some embodiments of the present disclosure.

FIG. 3 illustrates a cross-sectional view of a semiconductor package structure 3 according to some embodiments of the present disclosure. The semiconductor package structure 3 in FIG. 3 is similar to the semiconductor package structure 1 in FIG. 1. Therefore, some detailed descriptions may refer to corresponding preceding paragraphs and are not repeated hereinafter for conciseness, with differences therebetween as follows.

The semiconductor package structure 3 may include a landing portion 10*f* disposed over the backside surface 132 of the component 13, rather than the trace portion 10*t* of FIG. 1. The landing portion 10*f* may be narrower than the backside surface 132 of the component 13. In some embodiments, the landing portion 10*f* may be wider than or the same as the backside surface 132 of the component 13. The landing portion 10*f* may be connected to a land grid array (LGA) on an external substrate. The semiconductor package structure 3 further includes a passive component 18 disposed under the base portion 10*b*. The passive component 18 may be surrounded by the carrier 10. The passive component 18 may be disposed between the conductive pillars 10*p*. The passive component 18 may be spaced apart from the component 13 by at least one of the conductive pillars 10*p*. The carrier 10 (including the landing portion 10*f*, the base portion 10*b*, and the conductive pillars 10*p*), the dielectric layer 11, the protective layer 12, the component 13, the redistribution structure 14, the insulation layer 15, and the passive component 18 may be collectively referred to as a semiconductor package structure 300 electrically connected to other systems, components, and devices stacked thereover.

The semiconductor package structure 3 further includes a carrier 30 and a component 32 stacked over the semiconductor package structure 300. The carrier 30 may include a body portion attached to the landing portion 10*f* of the carrier 10 through the connection element 171. The component 32 may have a lower surface attached to the body portion of the carrier 30 through an adhesive layer 30*a*. The carrier 30 may include pin portions 301 and 302 attached to the base portion 10*b* of the carrier 10 through the connection element 171. The semiconductor package structure 3 may include a plurality of wirings 331 and 332. The wirings 331 and 332 may include a bond wiring. The semiconductor package structure 3 further includes an encapsulant 31 covering the carrier 30, the component 32, and the wirings 331 and 332.

The component 32 may include pads 32*p*1 and 32*p*2 disposed at an upper surface of the component 32. The pin portion 301 may include a pad 301*p* and the pin portion 302 may include a pad 302*p*. The pad 32*p*1 of the component 32 may be connected to the pad 301*p* of the pin portion 301 through the wiring 331. The pad 32*p*2 of the component 32 may be connected to the pad 302*p* of the pin portion 302 through the wiring 332.

The component 32 may be electrically connected to the semiconductor package structure 300 through the pin portions 301 and 302. An electrical transmission path S3 may be established among the component 32, the wiring 331, the carrier 30 (including the pin portion 301), the carrier (including the base portion 10*b* and the conductive pillar 10*p*), the passive component 18, the redistribution structure 14, and the component 13. The component 32 may be electrically connected to the component 13 through the base portion 10*b*, the conductive pillar 10*p*, and the redistribution structure 14. The component 32 may be electrically connected to the component 13 through the passive component 18. The passive component 18 may have a terminal connected to the base portion 10*b* and the other terminal connected to the conductive pillar 10*p*. The passive component 18 may be configured to filter the noise of the transmitted electrical signals between the components 13 and 32. The component 32, the carrier 30, and the passive component 18 may be collectively referred to as a system in package.

In the present disclosure, the component 32 stacked over the component 13 can be electrically connected to the double-tapering conductive pillars 10*p* which are formed by a partial-etching process from the carrier 10. The formation of the partially-etched conductive pillar requires a low cost, high throughput process, and the process costs of semiconductor package structure 3 can be reduced by eliminating at least one electroplating process. Furthermore, the partial-etched conductive pillars of the present disclosure can be more reliable than the electroplated conductive element.

FIG. 3A, FIG. 3B, FIG. 3C, FIG. 3D, FIG. 3E, and FIG. 3F illustrate one or more stages of an example of a method for manufacturing a semiconductor package structure (e.g., a semiconductor package structure 3) according to some embodiments of the present disclosure. The stages of the method for manufacturing the semiconductor package structure 3 may include the stages as illustrated in FIGS. 1A and 1B. The stages of FIG. 3A, FIG. 3B, FIG. 3C, FIG. 3D, FIG. 3E, and FIG. 3F may follow the stages of FIGS. 1A and 1B.

Figure 3A:
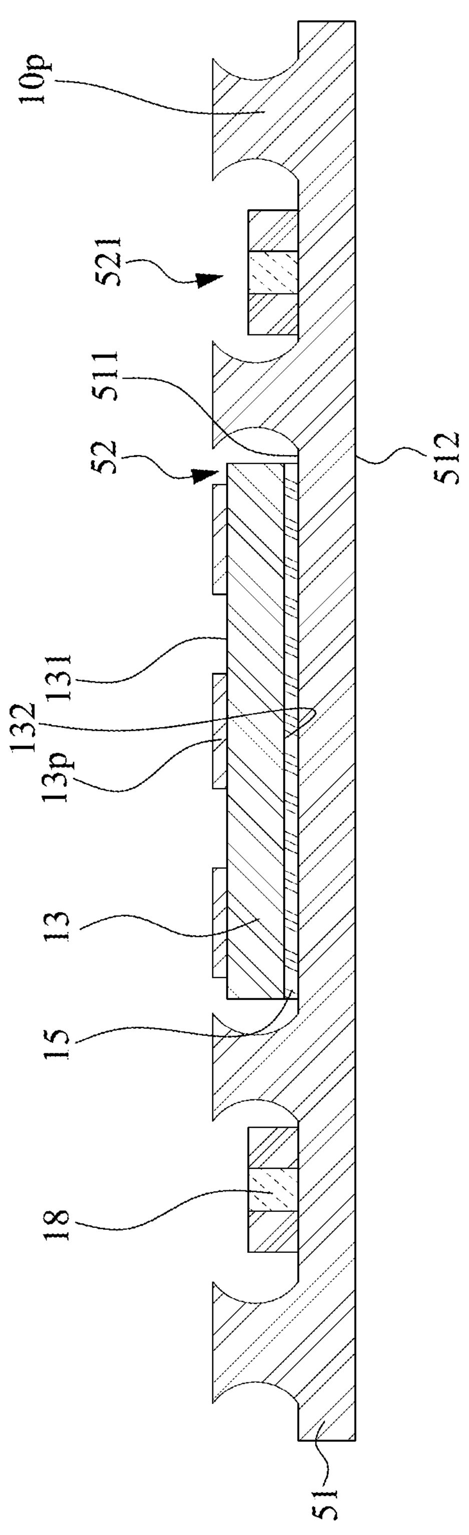
FIG. 3A, FIG. 3B, FIG. 3C, FIG. 3D, FIG. 3E, and FIG. 3F illustrate one or more stages of an example of a method for manufacturing a semiconductor package structure according to some embodiments of the present disclosure.

Referring to FIG. 3A, a component (or a die) 13 may be attached to the surface 511 of the conductive base 51 through an adhesive layer (or an insulation layer) 15. A passive component 18 may be attached to the surface 511 of the conductive base 51. The component 13 is within the space 52. The passive component 18 is within a space 521 between the conductive pillars 10*p*. The component 13 has an active surface 131 and a backside surface 132. The backside surface 132 faces the surface 511 of the conductive base 51. The component 13 may include a plurality of pads 13*p* at the active surface 131.

Figure 3B:
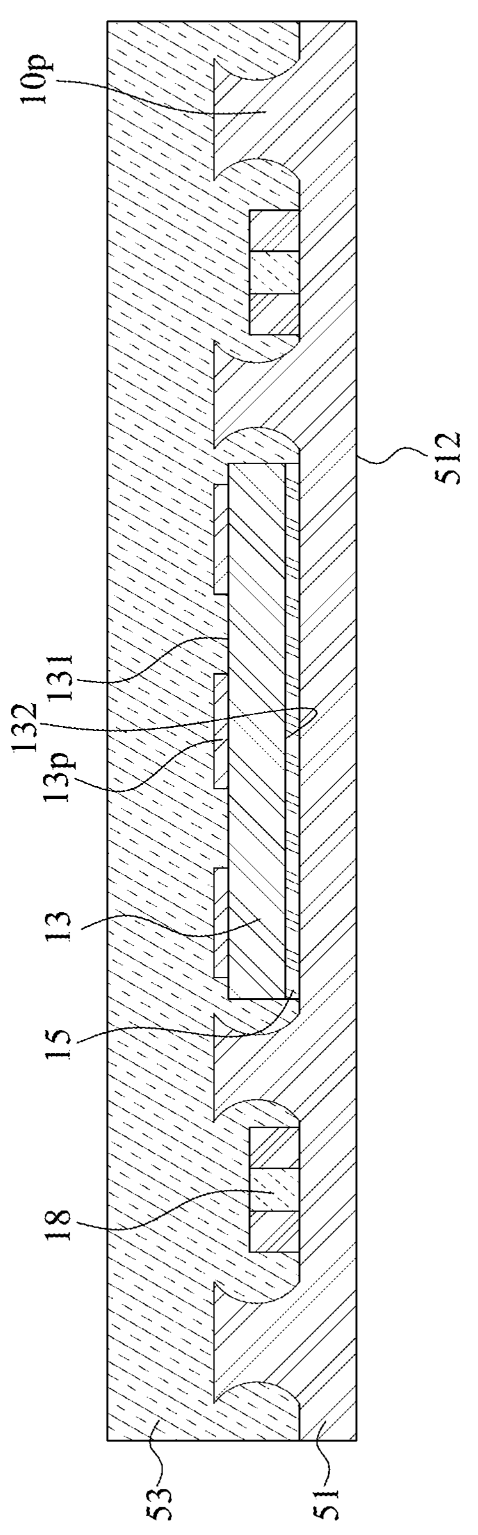

Regarding to FIG. 3B, a dielectric material 53 is formed on the conductive base 51 to encapsulate the conductive pillars 10*p*, the component 13, and the passive component 18. The dielectric material 53 may include a single layer or a lamination layer. The dielectric material 53 may include, for example, an organic material, such as a solder mask, a polyimide (PI), an Ajinomoto build-up film (ABF), and one or more molding compounds. The dielectric material 53 may include, for example, an inorganic material silicon-oxide ($SiO_x$), or a silicon-nitride ($SiN_x$).

Figure 3C:
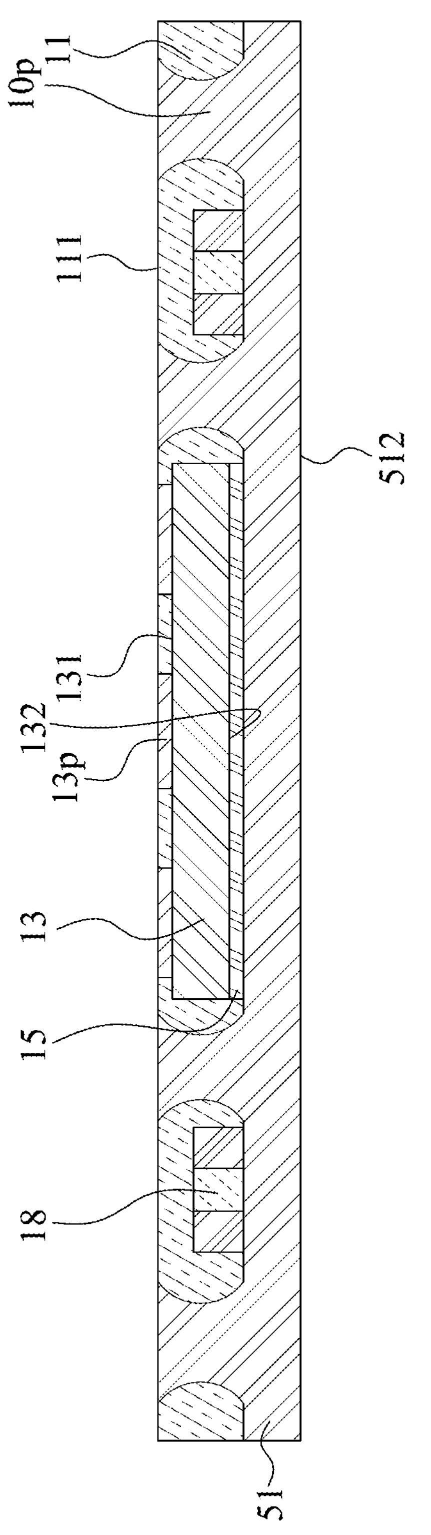

Referring to FIG. 3C, the dielectric material 53 is grinded to form a dielectric layer 11 having a surface 111 away from the conductive base 51. The surface 111 of the dielectric layer 11, an upper surface of the conductive pillar 10*p*, and/or an upper surface of the pads 13*p* are substantially coplanar. The passive component 18 may be covered by the dielectric layer 11.

Figure 3D:
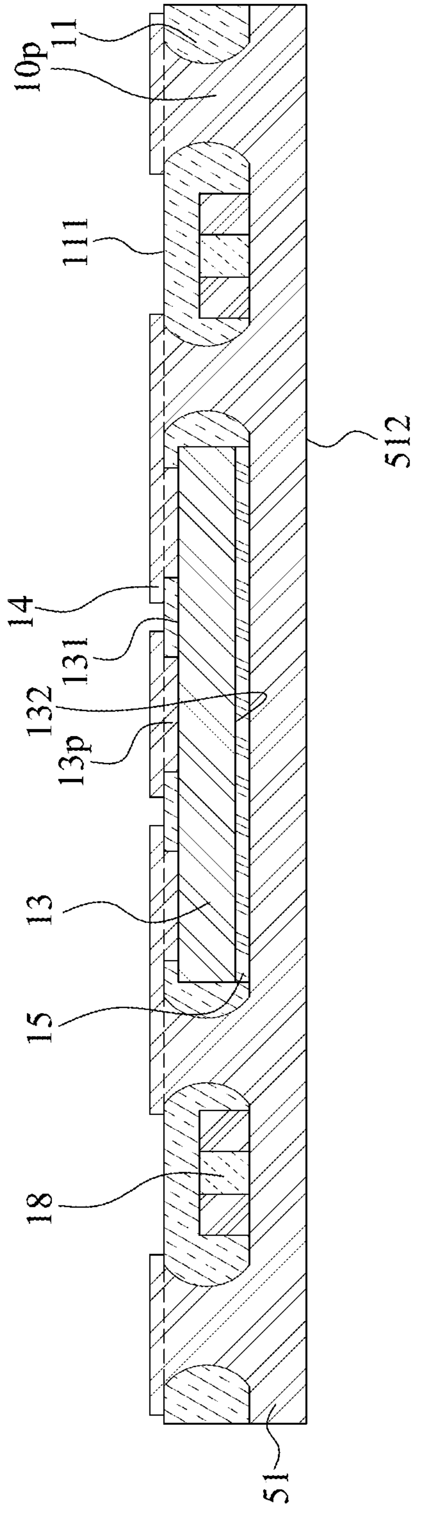

Referring to FIG. 3D, a redistribution structure 14 may be formed over the pads 13*p* of the component 13, the conductive pillars 10*p*, and the dielectric layer 11. The redistribution structure 14 may be formed by an electroplating process. The redistribution structure 14 may be electrically connected to the pads 13*p* of the component 13 and the conductive pillars 10*p*. The redistribution structure 14 may not have a seed layer. In some embodiments, the redistribution structure 14 may include a seed layer contacting the pads 13*p* of the component 13, the conductive pillars 10*p*, and the dielectric layer 11.

Figure 3E:
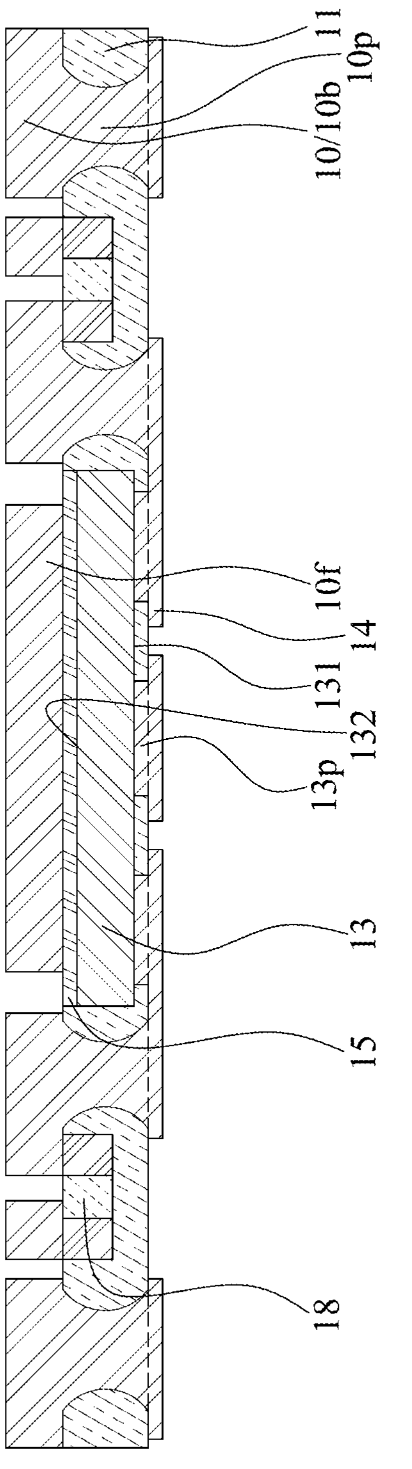

Referring to FIG. 3E, the conductive base 51 is etched from the surface 512 to form a base portion 10*b* over the conductive pillar 10*p* and a landing portion 10*f* over the backside surface 132 of the component 13. The base portion 10*b*, the landing portion 10*f*, and the conductive pillars 10*p* may be referred to as a carrier 10. The passive component 18 may be configured to electrically connect to the base portion 10*b* and the conductive pillar 10*p*. The passive component 18 may have a terminal connected to a section of the base portion 10*b* and the other terminal connected to another section of the base portion 10*b* that connects the conductive pillar 10*p*.

Figure 3F:
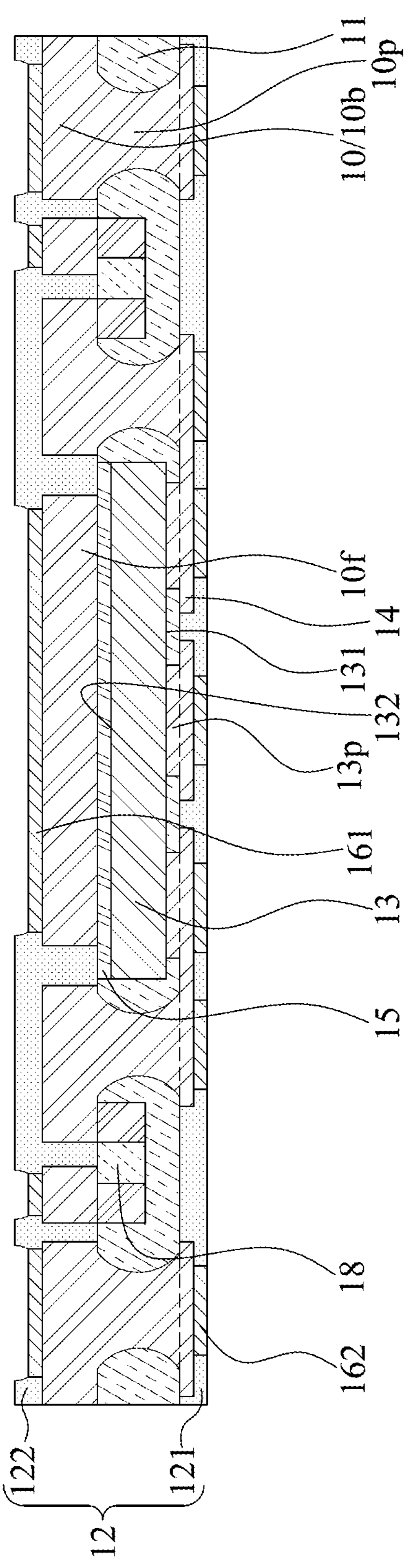

Referring to FIG. 3F, a portion 121 of a protective layer 12 is formed on the redistribution structure 14 and the other portion 122 of the protective layer 12 is formed on the landing portion 10*f* and the base portion 10*b* of the carrier 10 to form a semiconductor package structure 300 as shown in FIG. 3. A conductive layer 161 may be formed on the landing portion 10*f* and the base portion 10*b*. A conductive layer 162 may be formed on the redistribution structure 14. The conductive layers 161 and 162 may be surrounded by the protective layer 12.

Afterwards, a carrier 30 provided with an encapsulant 31, a component 32, a plurality of wirings 331 and 3323 may be bonded on the landing portion 10*f* and the base portion 10*b* of the carrier 10 to form a semiconductor package structure 3 as shown in FIG. 3. Furthermore, a plurality of connection elements 172 may be formed on the conductive layer 162.

Figure 4:
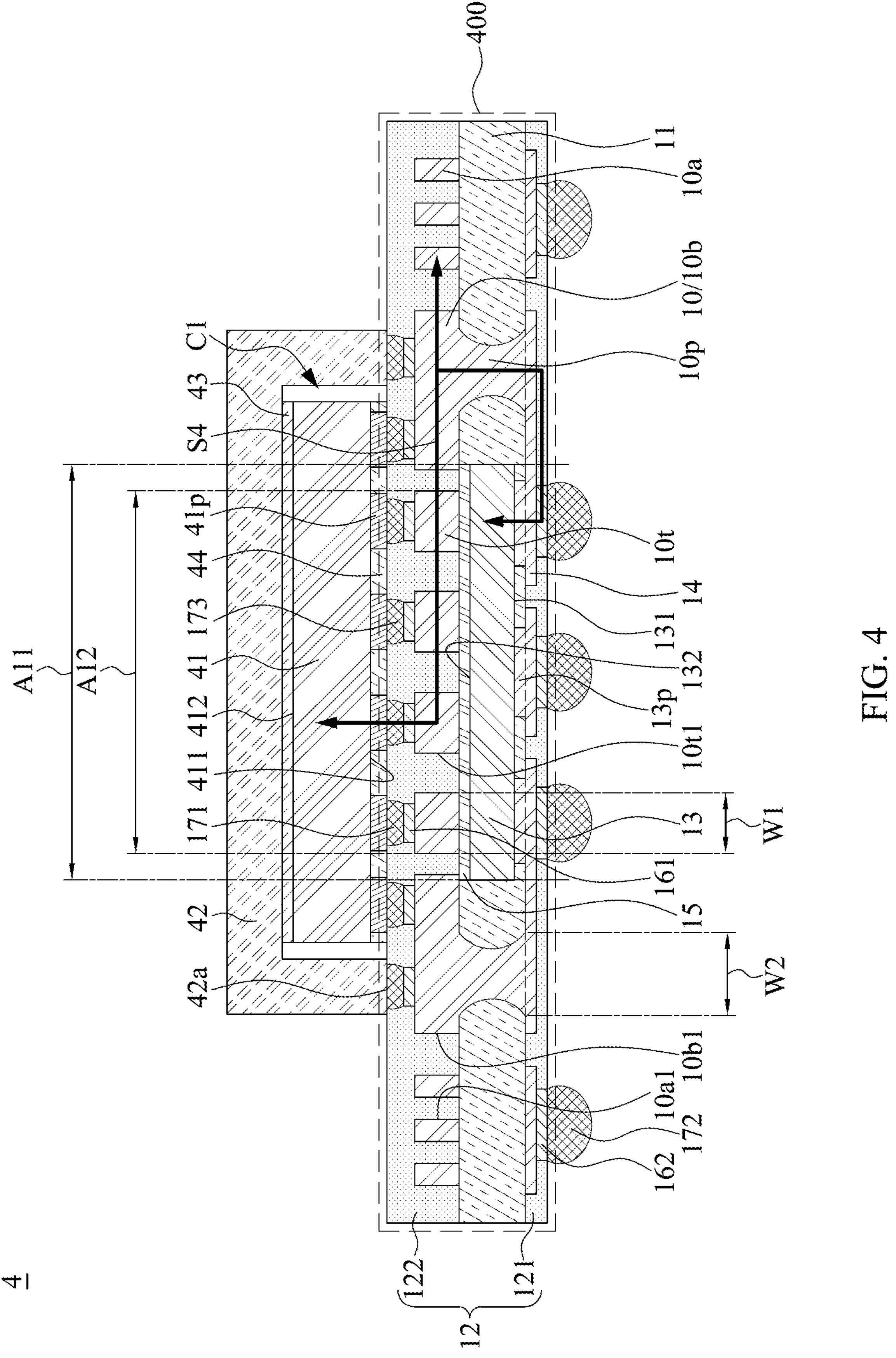
FIG. 4 illustrates a cross-sectional view of a semiconductor package structure according to some embodiments of the present disclosure.

FIG. 4 illustrates a cross-sectional view of a semiconductor package structure 4 according to some embodiments of the present disclosure. The semiconductor package structure 4 in FIG. 4 is similar to the semiconductor package structure 1 in FIG. 1. Therefore, some detailed descriptions may refer to corresponding preceding paragraphs and are not repeated hereinafter for conciseness, with differences therebetween as follows.

The carrier 10 of the semiconductor package structure 4 may further include an antenna pattern (or a part of the carrier 10) 10*a* separated from the trace portion 10*t*. In some embodiments, the base portion 10*b*, the trace portion 10*t*, the conductive pillars 10*p*, and the antenna pattern 10*a* of the carrier 10 may be integrally formed. In particular, the conductive pillars 10*p* may be formed by partial-etching the carrier 10 into a predetermined thickness. The trace portion 10*t* and the antenna pattern 10*a* may be formed by partial-etching the carrier 10 with a predetermined pattern. A lateral surface 10*t*1 of the trace portion 10*t* and a lateral surface 10*al* of the antenna pattern 10*a* of the carrier 10 have substantially the same roughness.

The antenna pattern 10*a* may be configured to receive or transmit a radiation signal. The conductive pillar 10*p* may be disposed between the trace portion 10*t* and the antenna pattern 10*a*. The conductive pillar 10*p* may be configured to function as a shielding structure. As such, that radiation signal of the antenna pattern 10*a* may not interfere with the trace portion 10*t*.

Forming the antenna pattern 10*a* by partial-etching the carrier 10 efficiently utilizes the side rail of the carrier. As such, the size of the semiconductor package structure 4 capable of receiving and transmitting a radiation signal can be relatively small.

The antenna pattern 10*a* may be disposed over the conductive pillars 10*p*. The base portion 10*b* may be disposed between the antenna pattern 10*a* and the trace portion 10*t*. The antenna pattern 10*a* may be connected to the base portion 10*b* in another cross section. The antenna pattern 10*a* may be disposed over the dielectric layer 11. The antenna pattern 10*a* may be surrounded by the portion 122 of the protective layer 12. The antenna pattern 10*a* may be electrically connected to the component 13 through, e.g., the conductive pillars 10*p* and the redistribution structure 14. The antenna pattern 10*a* may be non-overlapping with the component 13 in a direction vertical to the backside surface 132 of the component 13. In the cross section of FIG. 4, the antenna pattern 10*a* may include a plurality of sections separated from each other. In another cross section, one or more of the sections of the antenna pattern 10*a* may be connected. In some embodiments, the antenna pattern 10*a* may include a patch antenna or a spiral antenna.

The carrier 10 (including the trace portion 10*t*, the base portion 10*b*, the conductive pillars 10*p*, and the antenna pattern 10*a*), the dielectric layer 11, the protective layer 12, the component 13, the redistribution structure 14, and the insulation layer 15 may be collectively referred to as a semiconductor package structure 400 electrically connected to other systems, components, and devices stacked thereover. The semiconductor package structure 4 may further include a device 41 and a metal lid 42. The device 41 and the metal lid 42 may be collectively referred to as a package and may be stacked over and electrically connected to the semiconductor package structure 400.

The trace portion 10*t* may be configured to be electrically connected to the device 41 disposed over the trace portion 10*t*. The device 41 may have an active surface (or a lower surface) 411 and a backside surface (or an upper surface) 412 opposite to the active surface 411. The device 41 may include a plurality of pads 41*p* surrounded by an encapsulant 44 and electrically connected to the carrier 10 (the trace portion 10*t* and/or conductive pillar 10*p*). An electrical transmission path S4 may be established among the device 41, the carrier (including the trace portion 10*t*, the conductive pillar 10*p*, and the antenna pattern 10*a*), the redistribution structure 14, and the component 13. The device 41 may be electrically connected to the component 13 through the trace portion 10*t*, the conductive pillars 10*p*, and the redistribution structure 14. The redistribution structure 14 is disposed under and electrically connected to the device 41. The antenna pattern 10*a* may be electrically connected to the device 41. The device 41 may include one or more processing units configured to process the radiation signal from the antenna pattern 10*a*. In some embodiments, the device 41 may include a radio frequency device. The antenna pattern 10*a* may be non-overlapping with the device 41 in a direction vertical to the backside surface 132 of the component 13.

The metal lid 42 and the carrier 10 may collectively define a cavity C1 for accommodating the device 41. The conductive pillar 10*p* may be electrically connected to the metal lid 42 disposed over the trace portion 10*t*. The metal lid 42 may be configured to function as a shielding structure for the device 41. As such, the device 41 may not be interfered with unwanted radiation signals from an external environment. The metal lid 42 may be attached to the carrier 10 through an adhesive layer 42*a*. The metal lid 42 may be applied with a reference voltage (or a grounding voltage) through at least one of the conductive pillars 10*p*.

Furthermore, the metal lid 42 may be attached to the surface 412 of the device 41 through an adhesive material 43. The adhesive material 43 may be or include thermal interface material (TIM). The adhesive material 43 may include a conductive glue, such as tin-based glue. The metal lid 42 may function as a heat sink or connect to a further heat sink. The metal lid (or the heat sink) 42 may be thermally connected to the device 41. The metal lid 42 may be configured to dissipate heat from the semiconductor package structure 4. In particular, the metal lid 42 may dissipate heat from the device 41 through the adhesive material 43.

In some embodiments, the semiconductor package structure 4 may include a passive component (not shown, but is similar to the passive component 18) disposed under and electrically connected to the conductive pillar 10*p* and the antenna pattern 10*a*.

Figure 4A:
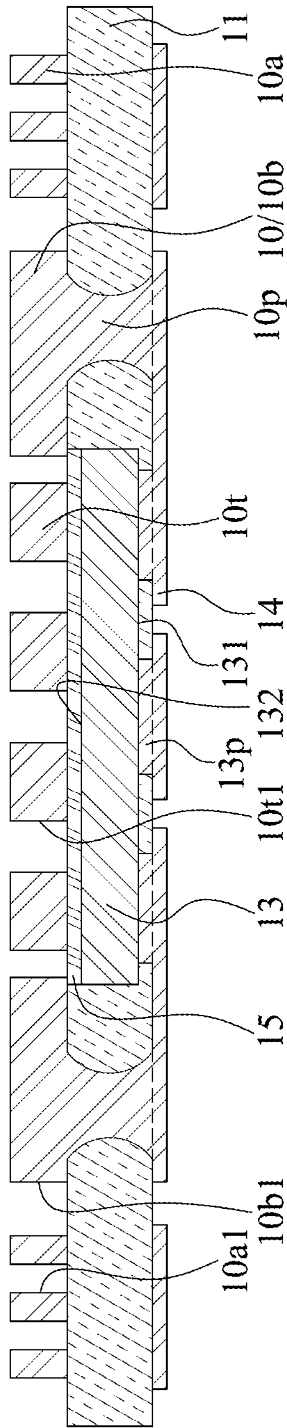
FIG. 4A and FIG. 4B illustrate one or more stages of an example of a method for manufacturing a semiconductor package structure according to some embodiments of the present disclosure.
Figure 4B:
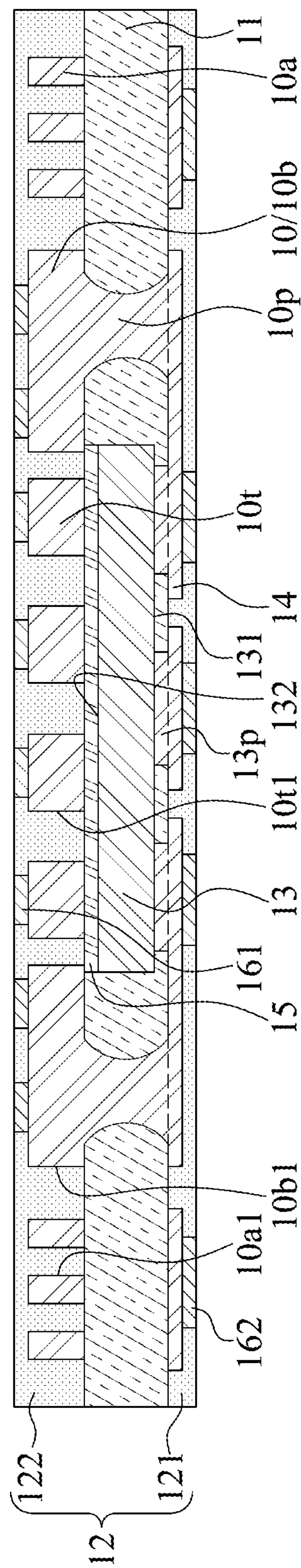

FIG. 4A and FIG. 4B illustrate one or more stages of an example of a method for manufacturing a semiconductor package structure (e.g., the semiconductor package structure 4) according to some embodiments of the present disclosure. The stages of the method for manufacturing the semiconductor package structure 4 may include the stages as illustrated in FIGS. 1A, 1B, 1C, 1D, 1E, and 1F. The stages of FIG. 4A and FIG. 4B may follow the stages of FIGS. 1A, 1B, 1C, 1D, 1E, and 1F.

Referring to FIG. 4A, the conductive base 51 is etched from the surface 512 to form a base portion 10*b* over the conductive pillar 10*p*, a trace portion 10*t* over the backside surface 132 of the component 13, and an antenna pattern 10*a*. The antenna pattern 10*a* and the trace portion 10*t* may be formed concurrently. The base portion 10*b*, the trace portion 10*t*, the conductive pillars 10*p*, and the antenna pattern 10*a* may be referred to as a carrier 10. The trace portion 10*t* may include a plurality of sections separated from each other in the cross section of FIG. 4A. In some embodiments, one or more of the sections of the trace portion 10*t* may be connected. The trace portion 10*t* may be separated from the base portion 10*b* in the cross section of FIG. 4A. The trace portion 10*t* may be connected to the base portion 10*b* in another cross section. The base portion 10*b* may be connected to the conductive pillars 10*p*. The antenna pattern 10*a* may be further from the trace portion 10*t* than the base portion 10*b*. The conductive pillar 10*p* may be disposed between the trace portion 10*t* and the antenna pattern 10*a*.

Referring to FIG. 4B, a portion 121 of a protective layer 12 is formed on the redistribution structure 14, and the other portion 122 of the protective layer 12 is formed on the trace portion 10*t*, the base portion 10*b*, and the antenna pattern 10*a* of the carrier 10 to form a semiconductor package structure 400 as shown in FIG. 4. A conductive layer 161 may be formed on the trace portion 10*t* and the base portion 10*b*. A conductive layer 162 may be formed on the redistribution structure 14. The conductive layers 161 and 162 may be surrounded by the protective layer 12.

Afterwards, a device 41 and a metal lid 42 may be bonded on the trace portion 10*t* and the conductive pillars 10*p* of the carrier 10 to form a semiconductor package structure 4 as shown in FIG. 4. Furthermore, a plurality of connection elements 172 may be formed on the conductive layer 162.

Figure 5:
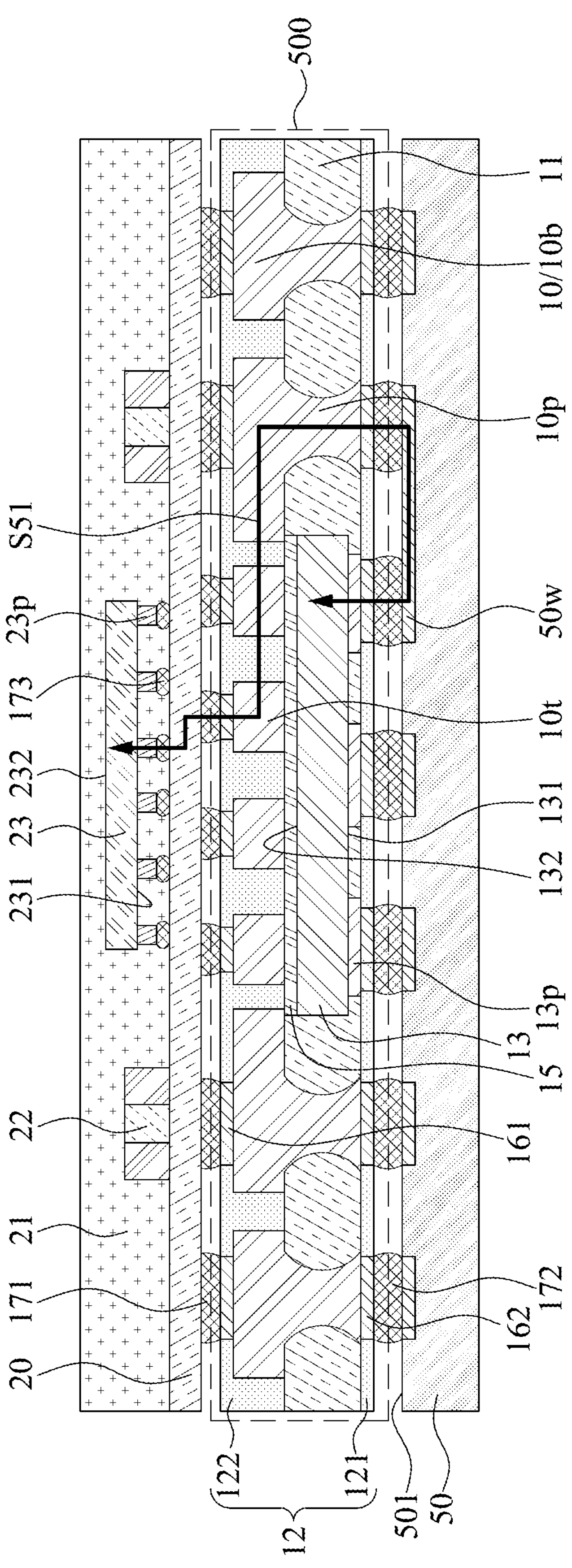
FIG. 5 illustrates a cross-sectional view of a semiconductor package structure according to some embodiments of the present disclosure.

FIG. 5 illustrates a cross-sectional view of a semiconductor package structure 5A according to some embodiments of the present disclosure. The semiconductor package structure 5A in FIG. 5 is similar to the semiconductor package structure 1 in FIG. 1. Therefore, some detailed descriptions may refer to corresponding preceding paragraphs and are not repeated hereinafter for conciseness, with differences therebetween as follows.

The semiconductor package structure 5A may further include a wiring structure 50 disposed below the carrier 10 or the component 13, rather than the redistribution structure 14 in FIG. 1. The wiring structure 50 may be configured to electrically connect the component 13 (or the pads 13*p*) to the carrier 10 (or the conductive pillars 10*p* and the trace portion 10*t*). The wiring structure 50 may include a conductive trace 50*w* disposed at a surface (or an upper surface) 501 of the wiring structure 50. The surface 501 may face the carrier 10 or the component 13. The conductive trace 50*w* may have a pattern density compatible with that of the pads 13*p* of the component 13.

The carrier 10 (including the trace portion 10*t*, the base portion 10*b*, and the conductive pillars 10*p*), the dielectric layer 11, the protective layer 12, the component 13, the insulation layer 15, and the connection elements 172 may be collectively referred to as a semiconductor package structure 500 electrically connected to other systems, components, and devices stacked thereover.

The component 13 may be electrically connected to the component 23 through the trace portion 10*t* and the wiring structure 50. An electrical transmission path S51 may be established among the component 23, the carrier 20, the trace portion 10*t*, the conductive pillars 10*p*, the conductive trace 50*w*, and the component 13. The component 13 may be electrically connected to the component 23 through the conductive trace 50*w* of the wiring structure 50. Hence, the semiconductor package structure 5A realizes the electrical connection of the stacking components 13 and 23 without an additional redistribution structure. The manufacturing cost of the semiconductor package structure 5A can be reduced by eliminating the process for the formation of a redistribution structure. Furthermore, the semiconductor package structure 5A may be particularly attractive in the high voltage/current applications.

Figure 5A:
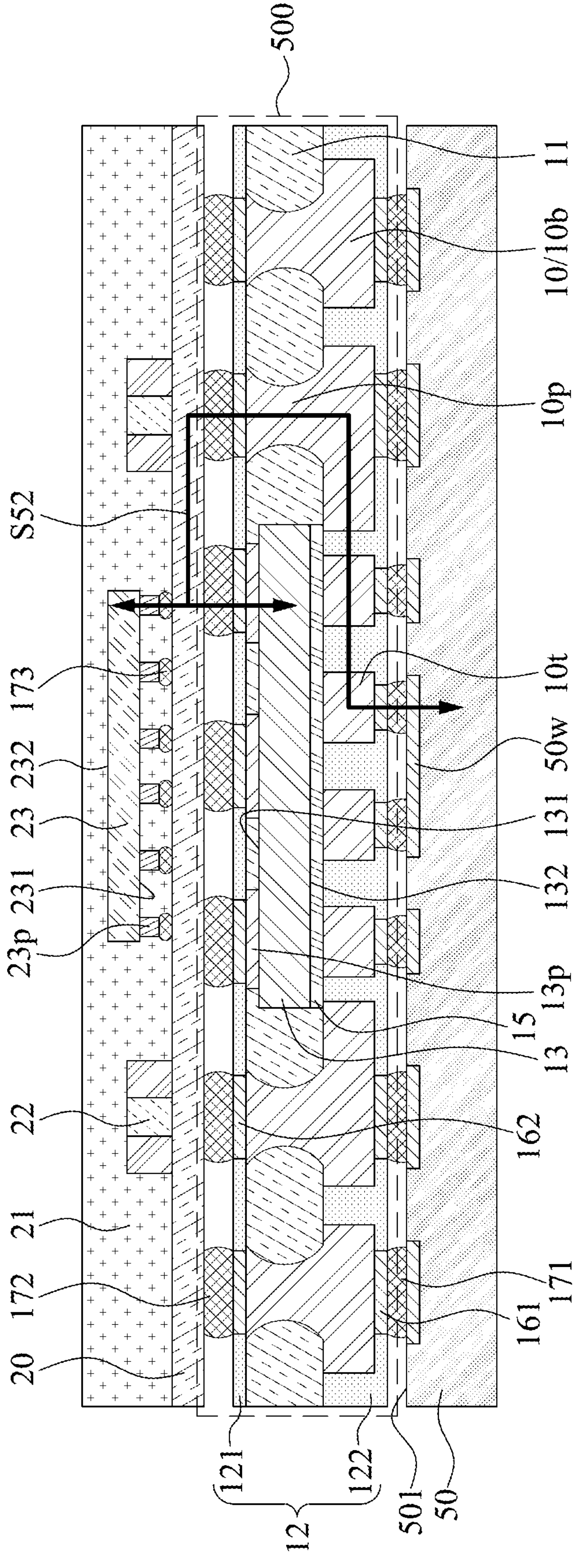
FIG. 5A illustrates a cross-sectional view of a semiconductor package structure according to some embodiments of the present disclosure.

FIG. 5A illustrates a cross-sectional view of a semiconductor package structure 5B according to some embodiments of the present disclosure. The semiconductor package structure 5B in FIG. 5A is similar to the semiconductor package structure 5A in FIG. 5. Therefore, some detailed descriptions may refer to corresponding preceding paragraphs and are not repeated hereinafter for conciseness, with differences therebetween as follows.

The semiconductor package structure 500 is reversely disposed between the carrier 20 and the wiring structure 50, as compared to the arrangement as illustrated in FIG. 5. The trace portion 10*t* of the carrier 10 may face the wiring structure 50. The active surface 312 of the component 13 may face the carrier 20.

The wiring structure 50 may be electrically connected to the component 23 through the carrier 10 (or the trace portion 10*t* and the conductive pillars 10*p*). An electrical transmission path S52 may be established among the component 23, the carrier 20, the component 13, the conductive pillars 10*p*, the trace portion 10*t*, and the conductive trace 50*w*. The component 13 may be electrically connected to the component 23 through the carrier 20. The component 13 may be electrically connected to the wiring structure 50 through the conductive pillars 10*p*, and the trace portion 10*t*.

FIG. 5B, FIG. 5C, FIG. 5D, and FIG. 5E illustrate one or more stages of an example of a method for manufacturing a semiconductor package structure (or the semiconductor package structure 5A or 5B) according to some embodiments of the present disclosure. The stages of the method for manufacturing the semiconductor package structure 5A or 5B may include the stages as illustrated in FIGS. 1A, 1B, 1C, 1D, and 1E. The stages of FIG. 5B, FIG. 5C, FIG. 5D, and FIG. 5E may follow the stages of FIGS. 1A, 1B, 1C, 1D, and 1E.

Figure 5B:
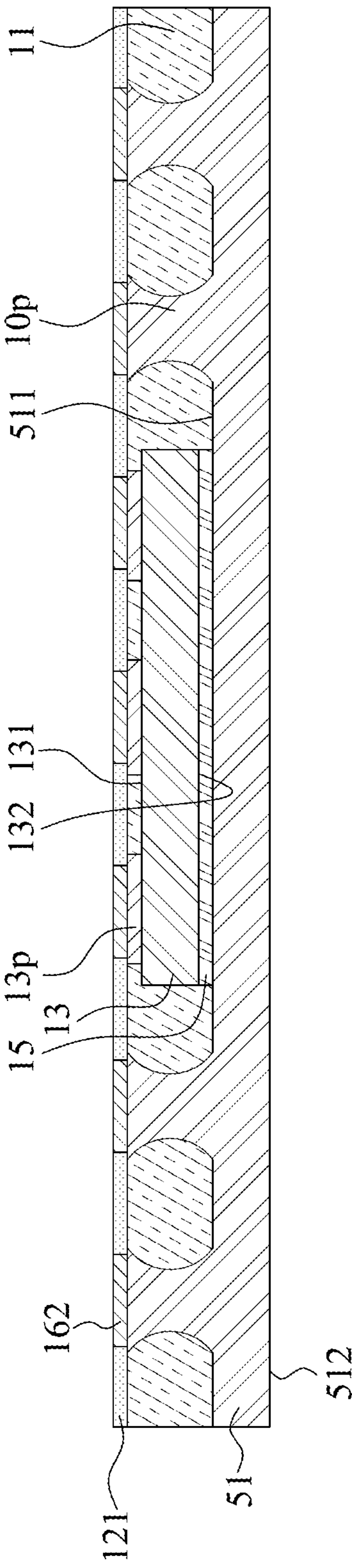
FIG. 5B, FIG. 5C, FIG. 5D, and FIG. 5E illustrate one or more stages of an example of a method for manufacturing a semiconductor package structure according to some embodiments of the present disclosure.

Referring to FIG. 5B, a portion 121 of a protective layer is formed on the pads 13*p* of the component 13 and the conductive pillars 10*p* as shown in FIG. 1. A conductive layer 162 may be formed on pads 13*p* and the conductive pillars 10*p*. The conductive layer 162 may be surrounded by the portion 121.

Figure 5C:
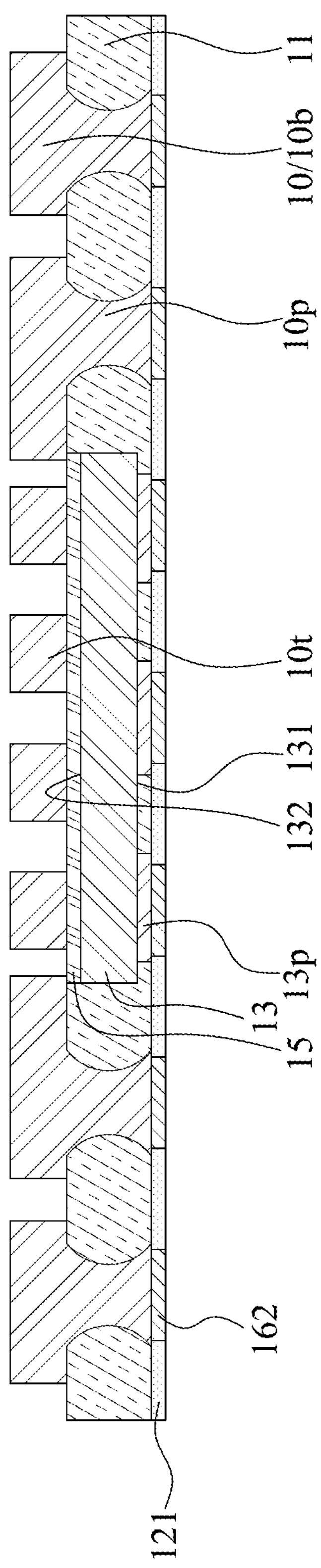

Referring to FIG. 5C, the conductive base 51 is etched from the surface 512 to form a base portion 10*b* over the conductive pillar 10*p* and a trace portion 10*t* over the backside surface 132 of the component 13. The base portion 10*b*, the trace portion 10*t*, and the conductive pillars 10*p* may be referred to as a carrier 10. The trace portion 10*t* may include a plurality of sections separated from each other in the cross section of FIG. 5C. In some embodiments, one or more of the sections of the trace portion 10*t* may be connected. The trace portion 10*t* may be separated from the base portion 10*b* in the cross section of FIG. 5C. The trace portion 10*t* may be connected to the base portion 10*b* in another cross section. The base portion 10*b* may be connected to the conductive pillars 10*p*.

Figure 5D:
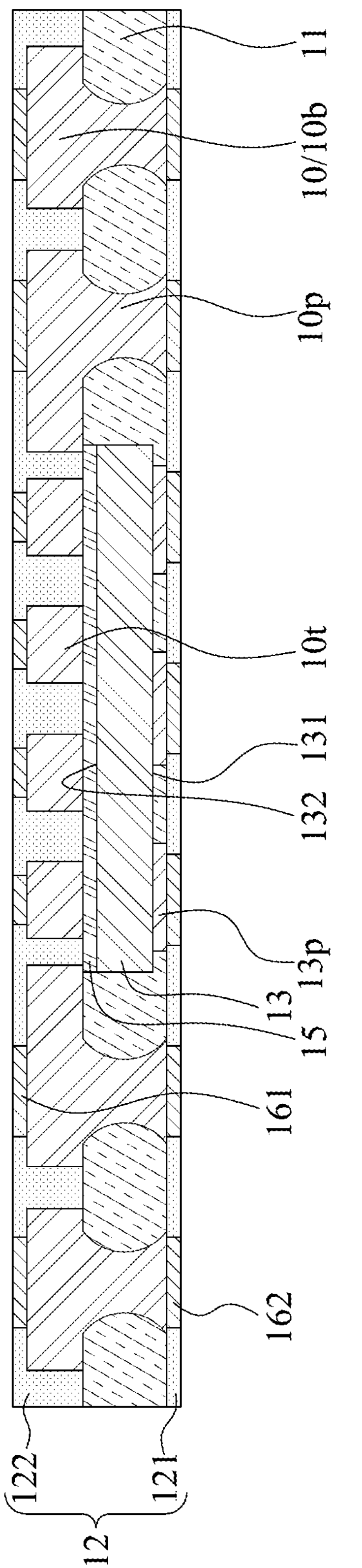

Referring to FIG. 5D, a portion 122 of the protective layer is formed on the trace portion 10*t* and the base portion 10*b* of the carrier 10. A conductive layer 161 may be formed on the trace portion 10*t* and the base portion 10*b*. The conductive layer 161 may be surrounded by the portion 122. The portions 121 and 122 may be collectively referred to as a protective layer 12.

Figure 5E:
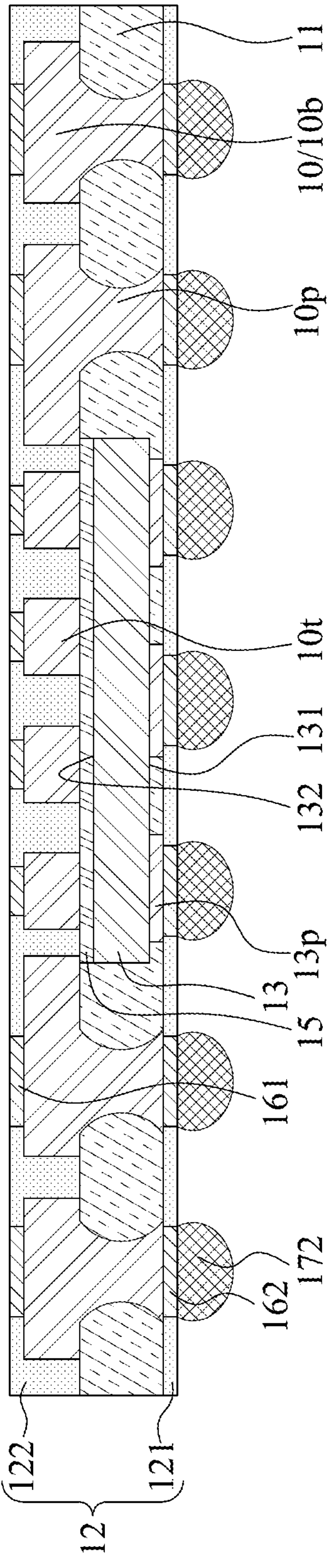

Referring to FIG. 5E, a plurality of connection elements 172 may be formed on the conductive layer 162 to form a semiconductor package structure 500 of FIG. 5. The connection elements 172 may include a ball grid array.

Afterwards, a carrier 20 provided with an encapsulant 21, a passive component 22, and a component 23 may be bonded on the trace portion 10*t* and the base portion 10*b* of the carrier 10 and a wiring structure 50 provided with a conductive trace 50*w* may be bonded on the connection elements 172 to form a semiconductor package structure 5A as shown in FIG. 5. In some embodiments, the carrier 20 provided with the encapsulant 21, the passive component 22, and the component 23 may be bonded on the pads 13*p* of the component 13 and the conductive pillars 10*p* of the carrier 10 and the wiring structure 50 provided with a conductive trace 50*w* may be bonded on the trace portion 10*t* and the base portion 10*b* to form a semiconductor package structure 5B as shown in FIG. 5A.

Figure 6:
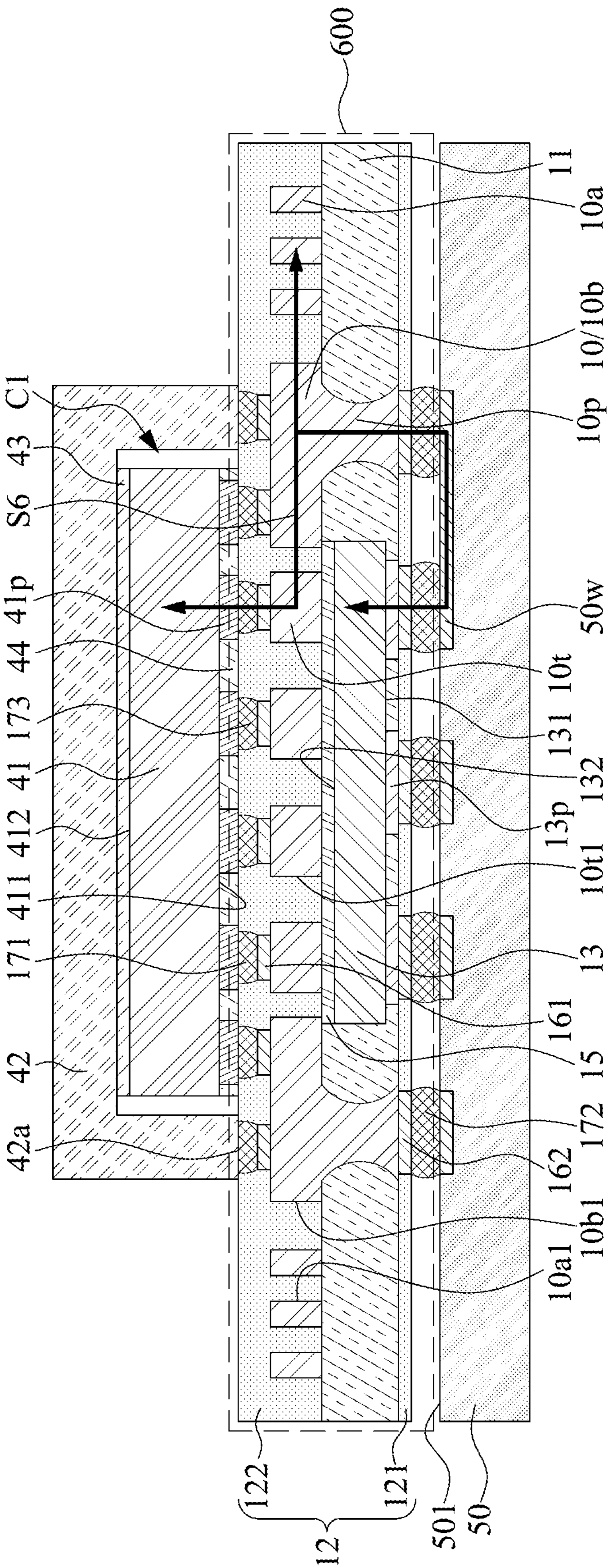
FIG. 6 illustrates a cross-sectional view of a semiconductor package structure according to some embodiments of the present disclosure.

FIG. 6 illustrates a cross-sectional view of a semiconductor package structure 6 according to some embodiments of the present disclosure. The semiconductor package structure 6 in FIG. 6 is similar to the semiconductor package structure 4 in FIG. 4. Therefore, some detailed descriptions may refer to corresponding preceding paragraphs and are not repeated hereinafter for conciseness, with differences therebetween as follows.

The semiconductor package structure 6 may further include a wiring structure 50 disposed below the carrier 10 or the component 13, rather than the redistribution structure 14 in FIG. 4. The wiring structure 50 may be configured to electrically connect the component 13 (or the pads 13*p*) to the carrier 10 (or the conductive pillars 10*p* and the trace portion 10*t*). The wiring structure 50 may include a conductive trace 50*w* disposed at a surface (or an upper surface) 501 of the wiring structure 50. The surface 501 may face the carrier 10 or the component 13. The conductive trace 50*w* may have a pattern density compatible with that of the pads 13*p* of the component 13.

The carrier 10 (including the trace portion 10*t*, the base portion 10*b*, the conductive pillars 10*p*, and the antenna pattern 10*a*), the dielectric layer 11, the protective layer 12, the component 13, the insulation layer 15, and the connection elements 172 may be collectively referred to as a semiconductor package structure 600 electrically connected to other systems, components, and devices stacked thereover.

The component 13 may be electrically connected to the device 41 through the trace portion 10*t* and the wiring structure 50. An electrical transmission path S6 may be established among the device 41, the carrier 20, the trace portion 10*t*, the conductive pillars 10*p*, the conductive trace 50*w*, and the component 13. The electrical transmission path S6 may be further established between the component 13 and the antenna pattern 10*a* or the device 41 and the antenna pattern 10*a*. The component 13 may be electrically connected to the device 41 through the conductive trace 50*w* of the wiring structure 50. The antenna pattern 10*a* may be electrically connected to the component 13 or the device 41. Hence, the semiconductor package structure 5A realizes the electrical connection of the stacking component 13 and device 41 without an additional redistribution structure. The manufacturing cost of the semiconductor package structure 6 can be reduced by saving the process for the formation of a redistribution structure.

Forming the antenna pattern 10*a* by partial-etching the carrier 10 can efficiently utilize the side rail of the carrier. As such, the size of the semiconductor package structure 6 capable of receiving and transmitting a radiation signal can be relatively small.

Figure 6A:
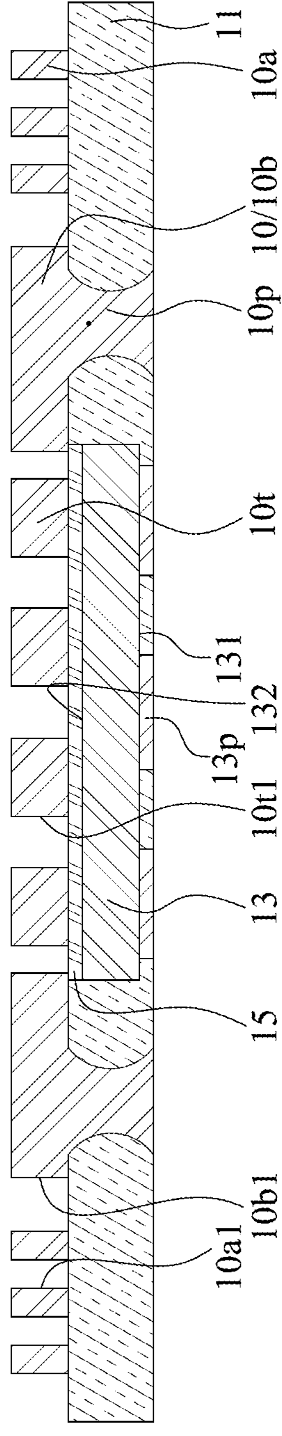
FIG. 6A and FIG. 6B illustrate one or more stages of an example of a method for manufacturing a semiconductor package structure according to some embodiments of the present disclosure.
Figure 6B:
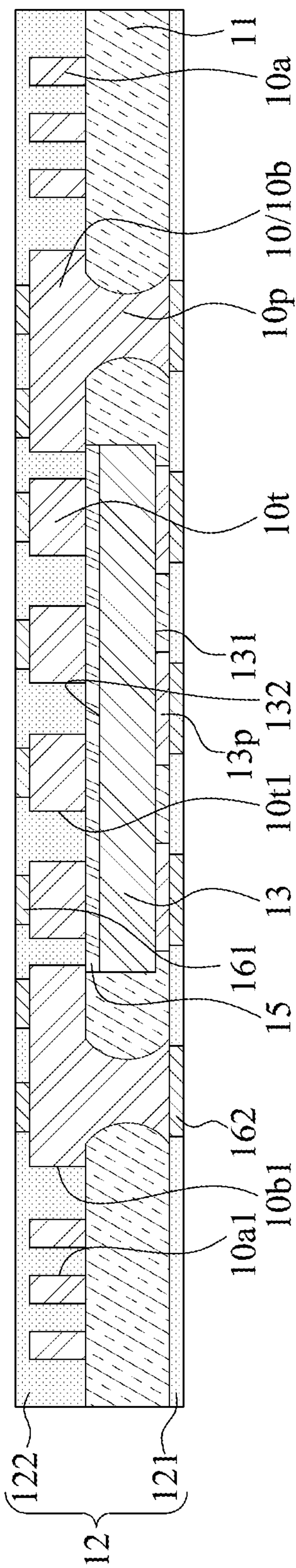

FIG. 6A and FIG. 6B illustrate one or more stages of an example of a method for manufacturing a semiconductor package structure (e.g., the semiconductor package structure 6) according to some embodiments of the present disclosure. The stages of the method for manufacturing the semiconductor package structure 6 may include the stages as illustrated in FIGS. 1A, 1B, 1C, 1D, and 1E. The stages of FIG. 6A and FIG. 6B may follow the stages of FIGS. 1A, 1B, 1C, 1D, and 1E.

Referring to FIG. 6A, the conductive base 51 is etched from the surface 512 to form a base portion 10*b* over the conductive pillar 10*p*, a trace portion 10*t* over the backside surface 132 of the component 13, and an antenna pattern 10*a*. The base portion 10*b*, the trace portion 10*t*, the conductive pillars 10*p*, and the antenna pattern 10*a* may be referred to as a carrier 10. The trace portion 10*t* may include a plurality of sections separated from each other in the cross section of FIG. 6A. In some embodiments, one or more of the sections of the trace portion 10*t* may be connected. The trace portion 10*t* may be separated from the base portion 10*b* in the cross section of FIG. 6A. The trace portion 10*t* may be connected to the base portion 10*b* in another cross section. The base portion 10*b* may be connected to the conductive pillars 10*p*. The antenna pattern 10*a* may be further from the trace portion 10*t* than the base portion 10*b*. The conductive pillar 10*p* may be disposed between the trace portion 10*t* and the antenna pattern 10*a*.

Referring to FIG. 6B, a portion 121 of a protective layer 12 is formed on the pads 13*p* and the conductive pillars 10*p*, and the other portion 122 of the protective layer 12 is formed on the trace portion 10*t*, the base portion 10*b*, and the antenna pattern 10*a* of the carrier 10. A conductive layer 161 may be formed on the trace portion 10*t* and the base portion 10*b*. A conductive layer 162 may be formed on the pads 13*p* and the conductive pillars 10*p*. The conductive layers 161 and 162 may be surrounded by the protective layer 12. The stages of FIG. 5E may follow the stages of FIG. 6B. That is, a plurality of connection elements 172 may be formed on the conductive layer 162 to form a semiconductor package structure 600 of FIG. 6. The connection elements 172 may include a ball grid array.

Afterwards, a device 41 and a metal lid 42 may be bonded on the trace portion 10*t* and the conductive pillars 10*p* of the carrier 10 and a wiring structure 50 provided with a conductive trace 50_w_ may be bonded on the connection elements 172 to form a semiconductor package structure 6 as shown in FIG. 6.

Figure 7:
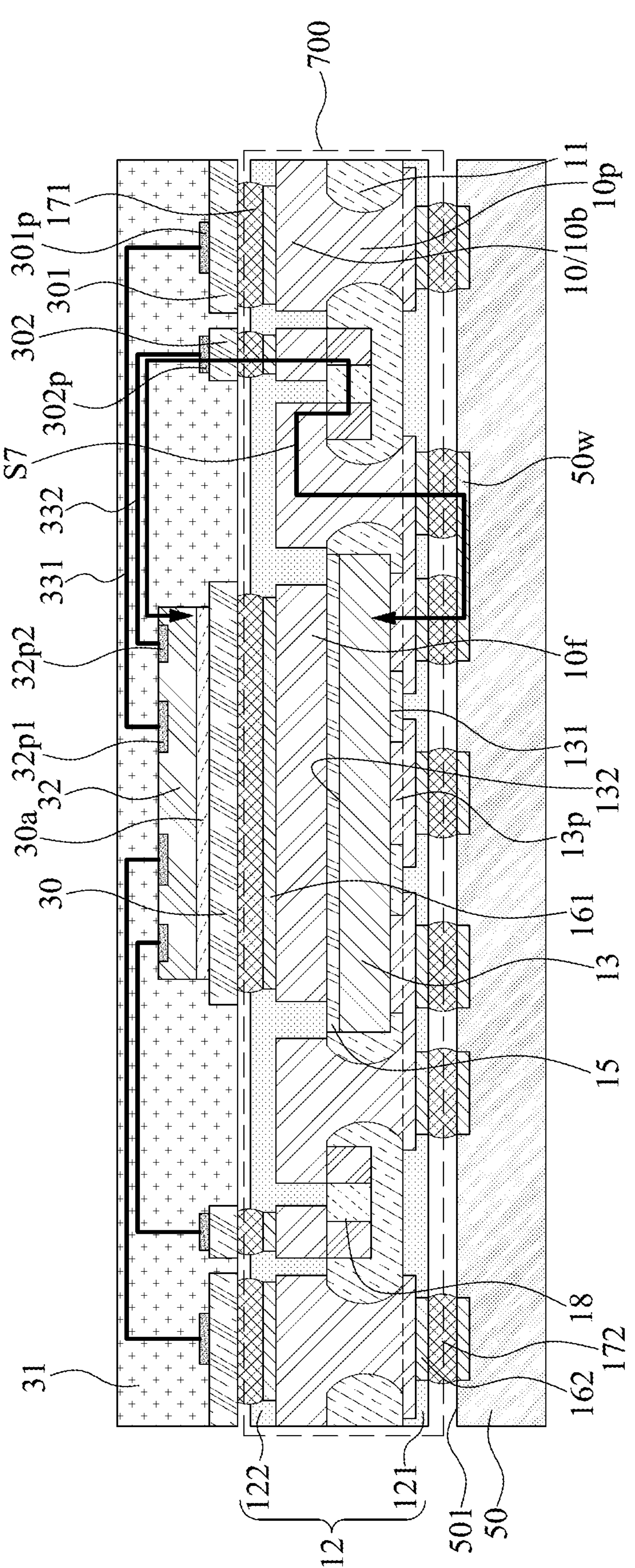
FIG. 7 illustrates a cross-sectional view of a semiconductor package structure according to some embodiments of the present disclosure.

FIG. 7 illustrates a cross-sectional view of a semiconductor package structure 7 according to some embodiments of the present disclosure. The semiconductor package structure 7 in FIG. 7 is similar to the semiconductor package structure 3 in FIG. 3. Therefore, some detailed descriptions may refer to corresponding preceding paragraphs and are not repeated hereinafter for conciseness, with differences therebetween as follows.

The semiconductor package structure 7 may further include a wiring structure 50 disposed below the carrier 10 or the component 13, rather than the redistribution structure 14 in FIG. 3. The wiring structure 50 may be configured to electrically connect the component 13 (or the pads 13_p_) to the carrier 10 (or the conductive pillars 10_p_ and the base portion 10_b_). The wiring structure 50 may include a conductive trace 50_w_ disposed at a surface (or an upper surface) 501 of the wiring structure 50. The surface 501 may face the carrier 10 or the component 13. The conductive trace 50_w_ may have a pattern density compatible with that of the pads 13_p_ of the component 13.

The carrier 10 (including the landing portion 10_f_, the base portion 10_b_, and the conductive pillars 10_p_), the dielectric layer 11, the protective layer 12, the component 13, the insulation layer 15, the passive component 18, and the connection elements 172 may be collectively referred to as a semiconductor package structure 700 electrically connected to other systems, components, and devices stacked thereover.

The component 13 may be electrically connected to the component 32 through the conductive pillars 10_p_ and base portion 10_b_ of the carrier 10 and the wiring structure 50. An electrical transmission path S7 may be established among the component 32, the carrier 30, the base portion 10_b_, the passive component 18, the conductive pillar 10_p_, the conductive trace 50_w_, and the component 13. The component 13 may be electrically connected to the component 23 through the conductive trace 50_w_ of the wiring structure 50. Hence, the semiconductor package structure 7 realizes the electrical connection of the stacking components 13 and 32 without an additional redistribution structure. The manufacturing cost of the semiconductor package structure 7 can be reduced by eliminating the process for the formation of a redistribution structure.

Figure 7A:
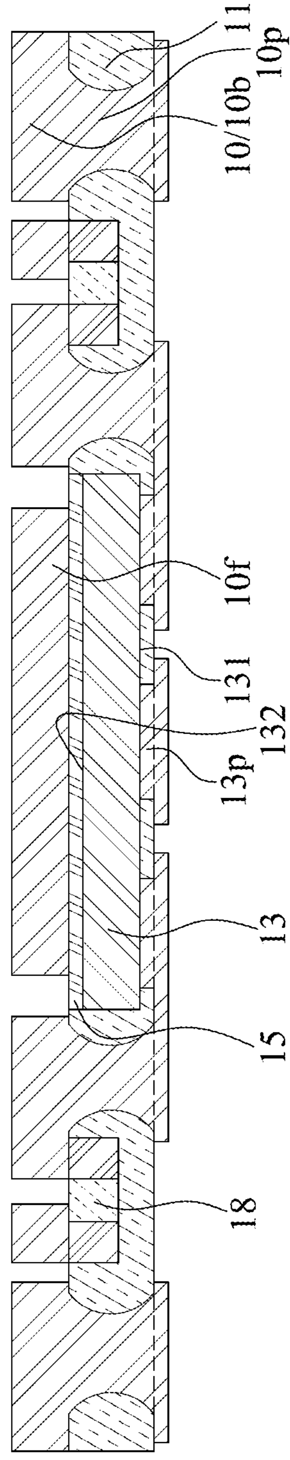
FIG. 7A and FIG. 7B illustrate one or more stages of an example of a method for manufacturing a semiconductor package structure according to some embodiments of the present disclosure.
Figure 7B:
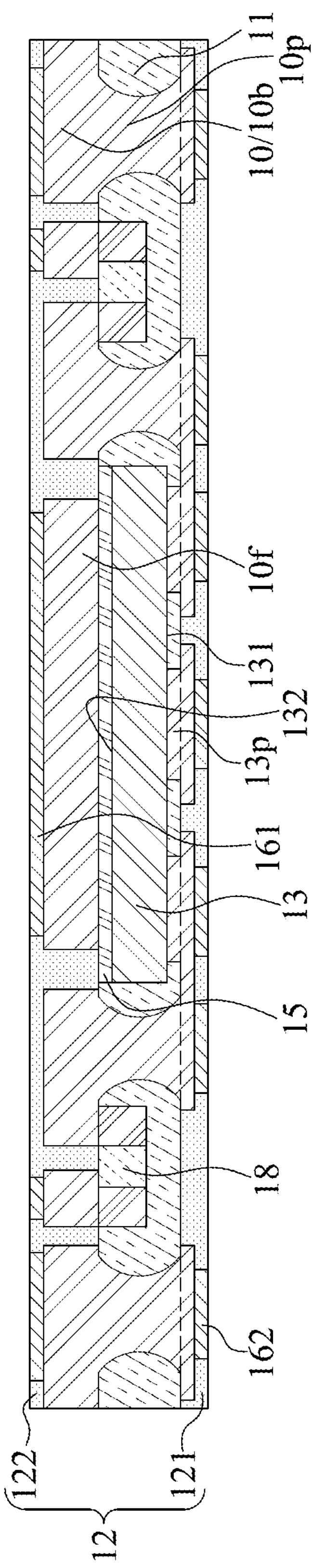

FIG. 7A and FIG. 7B illustrate one or more stages of an example of a method for manufacturing a semiconductor package structure (e.g., the semiconductor package structure 7) according to some embodiments of the present disclosure. The stages of the method for manufacturing the semiconductor package structure 7 may include the stages as illustrated in FIGS. 1A and 1B, as well as FIGS. 3A, 3B, and 3C. The stages of FIG. 7A and FIG. 7B may follow the stages of FIGS. 1A, 1B, 3A, 3B, and 3C.

Referring to FIG. 7A, the conductive base 51 is etched from the surface 512 to form a base portion 10_b_ over the conductive pillar 10_p_ and a landing portion 10_f_ over the backside surface 132 of the component 13. The base portion 10_b_, the landing portion 10_f_, and the conductive pillars 10_p_ may be referred to as a carrier 10. The passive component 18 may be configured to electrically connect to the base portion 10_b_ and the conductive pillar 10_p_. The passive component 18 may have a terminal connected to a section of the base portion 10_b_ and the other terminal connected to another section of the base portion 10_b_ that connects the conductive pillar 10_p_.

Referring to FIG. 7B, a portion 121 of a protective layer 12 is formed on the pads 13_p_ of the component 13 and the conductive pillars 10_p_, and the other portion 122 of the protective layer 12 is formed on the landing portion 10_f_ and the base portion 10_b_ of the carrier 10. A conductive layer 161 may be formed on the landing portion 10_f_ and the base portion 10_b_. A conductive layer 162 may be formed on the pads 13_p_ and the conductive pillars 10_p_. The conductive layers 161 and 162 may be surrounded by the protective layer 12. The stages of FIG. 5E may follow the stages of FIG. 7B. That is, a plurality of connection elements 172 may be formed on the conductive layer 162 to form a semiconductor package structure 700 of FIG. 7. The connection elements 172 may include a ball grid array.

Afterwards, a carrier 30 provided with an encapsulant 31 and a component 32 may be bonded on the landing portion 10_f_ and the base portion 10_b_ of the carrier 10 and a wiring structure 50 provided with a conductive trace 50_w_ may be bonded on the connection elements 172 to form a semiconductor package structure 7 as shown in FIG. 7.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to +10% of that numerical value, such as less than or equal to +5%, less than or equal to +4%, less than or equal to +3%, less than or equal to +2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 10+S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:

a leadframe comprising a first part and a second part separated from the first part, wherein the first part has a first width and the second part has a second width larger than the first width;

a component disposed under the first part and electrically connected to the second part, wherein the first part is configured to be electrically connected to a device disposed over the first part; and a dielectric layer partially embedding the leadframe and the component, wherein the first part and the second part have the same height and are at the same elevation with respect to the dielectric layer.

2. The semiconductor package structure of claim 1, wherein the leadframe comprises a third part disposed under the second part and having a curved surface.

3. The semiconductor package structure of claim 1, wherein the first part and the second part are disposed on a top surface of the dielectric layer.

4. The semiconductor package structure of claim 3, wherein a trace portion of the first part comprises a plurality of sections separated from each other, and wherein at least one of the sections of the trace portion of the first part is exposed from an insulation layer disposed between the trace portion and a backside surface of the component, wherein the trace portion further comprises a plurality of bending sections staggered and separated from each other, and wherein the insulation layer includes a thermal interface material configured to thermally conduct heat from the component to the leadframe.

5. The semiconductor package structure of claim 1, wherein the leadframe comprises a third part disposed below the first part and the second part, and wherein the third part is electrically connected to the component and wherein the second part is non-overlapping with the component in a direction perpendicular to a backside surface of the component.

6. The semiconductor package structure of claim 1, further comprising a conductive layer including electroless Nickel immersion Gold and disposed on at least one of the first part and the second part, a solder bump disposed on the conductive layer, and an intermetallic layer between the conductive layer and the solder bump.

7. The semiconductor package structure of claim 1, further comprising a redistribution structure disposed under the component and separated from the first part and the second part by the component, wherein the component is electrically connected to the device through the first part, the second part, and the redistribution structure.

8. A semiconductor package structure, comprising:

a leadframe; and a component disposed under the leadframe and comprising a plurality of pads at an active surface of the component;

wherein the leadframe comprises a trace portion disposed over a backside surface of the component and a base portion non-overlapping with the component in a direction perpendicular to the backside surface, and wherein the trace portion is electrically insulated from the backside surface of the component and electrically connected to the pads of the component; and a protective layer covering and contacting a lateral surface of the trace portion and a lateral surface of the base portion.

9. The semiconductor package structure of claim 8, wherein the trace portion and the base portion have the same height and are at the same elevation with respect to the component and non-overlapping with each other.

10. The semiconductor package structure of claim 9, wherein the leadframe comprises a conductive pillar adjacent to the component and extending from the trace portion in the direction, and wherein the conductive pillar is electrically connected to the component through a redistribution structure disposed below the component, and wherein the conductive pillar has a curved and inwardly dished lateral surface and includes a monolithic structure.

11. The semiconductor package structure of claim 10, further comprising a dielectric layer embedding the conductive pillar and conforming to the curved and inwardly dished lateral surface of the conductive pillar.

12. The semiconductor package structure of claim 8, wherein the leadframe comprises an antenna pattern non-overlapping with the component in a direction vertical to the backside surface thereof, wherein the trace portion and the antenna pattern have the same height and are at the same elevation with respect to the component, wherein the protective layer covers and contacts a lateral surface of the antenna pattern, and wherein the protective layer contacts a top surface of the antenna pattern, without contacting a bottom surface of the antenna pattern.

13. The semiconductor package structure of claim 12, further comprising a redistribution structure disposed on the active surface of the component and electrically connected to the pads of the component and the trace portion of the leadframe, wherein the leadframe comprises a conductive pillar disposed between the trace portion and the antenna pattern, and wherein the antenna pattern is electrically connected to the component through the conductive pillar and the redistribution structure, and wherein the conductive pillar has a curved surface.

14. The semiconductor package structure of claim 8, wherein the protective layer covers a portion of a top surface of the trace portion, without covering a bottom surface of the trace portion, and wherein the protective layer covers a portion of a top surface of the base portion, without covering a bottom surface of the base portion.

15. A semiconductor package structure, comprising:

a leadframe; and a component surrounded by the leadframe;

wherein the leadframe comprises an interconnection element adjacent to the component, and wherein the interconnection element has a first curved portion and a second curved portion connected to the first curved portion, wherein the first curved portion and the second curved portion curve in opposite directions and are at different elevation with respect to an active surface of the component.

16. The semiconductor package structure of claim 15, wherein the interconnection element has a central width smaller than a bottom width, and wherein the central width is the smallest width of the interconnection element.

17. The semiconductor package structure of claim 15, wherein the interconnection element has a concave and curved lateral surface.

18. The semiconductor package structure of claim 17, wherein the leadframe comprises a base portion connected to the interconnection element, and a trace portion, and wherein the base portion is disposed around the trace portion, wherein the interconnection element contacts the base portion, without contacting the trace portion.

19. The semiconductor package structure of claim 18, further comprising:

a protective layer covering and contacting a lateral surface of the trace portion and a lateral surface of the base portion, wherein the protective layer covers a portion of a top surface of the trace portion, without covering a bottom surface of the trace portion, and wherein the protective layer covers a portion of a top surface of the base portion, without covering a bottom surface of the base portion;

a dielectric layer embedding the interconnection element and the component, wherein the trace portion and the base portion are disposed on the dielectric layer, have the same height, and are at the same elevation with respect to the dielectric layer.

20. The semiconductor package structure of claim 15, further comprising a dielectric layer embedding the interconnection element and the component and having a curved lateral surface conforming to the first curved portion and the second curved portion, wherein the curved lateral surface has a convex profile.

* * * * *